US012787519B2

(12) United States Patent
Jeong et al.

(10) Patent No.: US 12,787,519 B2
(45) Date of Patent: Nov. 3, 2026

(54) DISPLAY DEVICE AND TILED DISPLAY DEVICE INCLUDING THE SAME

(71) Applicant: Samsung Display Co., LTD., Yongin-si (KR)

(72) Inventors: Jun Ki Jeong, Yongin-si (KR); Hyun Joon Kim, Yongin-si (KR); Kye Uk Lee, Yongin-si (KR); Sang Jin Jeon, Yongin-si (KR); Jung Hwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 642 days.

(21) Appl. No.: 17/896,693

(22) Filed: Aug. 26, 2022

(65) Prior Publication Data

US 2023/0268474 A1 Aug. 24, 2023

(30) Foreign Application Priority Data

Jan. 21, 2022 (KR) ........................ 10-2022-0009518

(51) Int. Cl.
*H10H 20/857* (2025.01)
*G09F 9/302* (2006.01)
(Continued)

(52) U.S. Cl.
CPC ......... *H10H 20/857* (2025.01); *G09F 9/3026* (2013.01); *G09F 9/33* (2013.01); *H10H 20/8312* (2025.01); *H10W 90/00* (2026.01)

(58) Field of Classification Search
CPC ............. H10H 20/857; H10H 20/8312; H10H 29/142; H10H 20/85; G09F 9/3026; G09F 9/33; G09F 9/302; G09F 9/3023; H10W 90/00; H10W 42/60; H10D 86/441; H10D 86/60; H10D 86/40; G09G 2300/026;
(Continued)

(56) References Cited

U.S. PATENT DOCUMENTS 8,493,284 B2 7/2013 Hajjar
9,575,241 B2 2/2017 Park
(Continued)

FOREIGN PATENT DOCUMENTS

CN 101958111 A 1/2011
KR 10-2017-0080962 7/2017
(Continued)

*Primary Examiner* — Tan N Tran
(74) *Attorney, Agent, or Firm* — Womble Bond Dickinson (US) LLP

(57) ABSTRACT

A display device including a substrate that includes a display area and a non-display area disposed at a side of the display area. The display area includes first through fourth areas. The fourth area includes a first sub-area adjacent to at least one of the first to third areas, and a second sub-area excluding the first sub-area. At least the second sub-area includes first pixels disposed in a first direction in a first pixel row, second pixels disposed in the first direction in a second pixel row that is a next row of the first pixel row, the second pixels spaced apart from the first pixels, a clock line extending in a second direction intersecting the first direction, and a gate driver including a first stage disposed left of the clock line in a plan view, and a second stage disposed right of the clock line in a plan view.

19 Claims, 23 Drawing Sheets

(51) Int. Cl.
*G09F 9/33* (2006.01)
*H10H 20/831* (2025.01)
*H10W 90/00* (2026.01)

(58) Field of Classification Search
CPC .............. G09G 2300/0426; G09G 3/32; G06F 3/1446; H10K 59/1131; H10K 59/18; H10K 59/12; H01L 25/0753; H01L 23/60
See application file for complete search history.

(56) References Cited

U.S. PATENT DOCUMENTS

| | | | | |
|---|---|---|---|---|
| 10,025,414 | B2 | 7/2018 | Park et al. | |
| 10,403,207 | B2 * | 9/2019 | Kang | G09G 3/3266 |
| 10,424,602 | B2 * | 9/2019 | Wang | G09G 3/20 |
| 11,393,408 | B2 * | 7/2022 | Li | G09G 3/3225 |
| 11,393,804 | B2 | 7/2022 | Lee et al. | |
| 11,678,533 | B2 | 6/2023 | Ryu et al. | |
| 2017/0255074 | A1 | 9/2017 | Nishiyama et al. | |
| 2018/0301104 | A1 | 10/2018 | Hao | |
| 2019/0317372 | A1 * | 10/2019 | Tsai | G02F 1/13394 |
| 2020/0302840 | A1 | 9/2020 | Kim et al. | |

FOREIGN PATENT DOCUMENTS

| | | | |
|---|---|---|---|
| KR | 10-2020-0018746 | A | 2/2020 |
| KR | 10-2021-0018582 | | 2/2021 |
| KR | 10-2021-0028295 | A | 3/2021 |
| KR | 10-2272216 | | 7/2021 |
| KR | 10-2336709 | | 12/2021 |

* cited by examiner

DISPLAY DEVICE AND TILED DISPLAY DEVICE INCLUDING THE SAME

CROSS-REFERENCE TO RELATED APPLICATION(S)

This application claims priority to and the benefits of Korean Patent Application No. 10-2022-0009518 under 35 U.S.C. § 119, filed in the Korean Intellectual Property Office (KIPO) on Jan. 21, 2022, the entire contents of which are incorporated herein by reference.

BACKGROUND

1. Technical Field

The disclosure relates to a display device and a tiled display device including the same.

2. Description of the Related Art

Recently, as interest in information display is increasing, research and development for display devices is continuously conducted.

SUMMARY

The disclosure has been made in an effort to provide a display device and a tiled display device including the same that, by disposing a first stage at a left side of a signal line (for example, a clock line) and a second stage at a right side thereof between two adjacent unit pixel rows, may increase freedom of arrangement of a gate driver regardless of an increase in resolution to secure an integrated space of the gate driver.

In addition, the disclosure has been made in an effort to provide a display device and a tiled display device including the same that may configure a more natural screen by reducing a sense of disconnection between a plurality of display devices by minimizing a non-display area between display devices (or display panels).

A display device according to an embodiment may include a substrate that includes a display area and a non-display area disposed at least at a side of the display area, the substrate being made of glass. The display area may include a first area including an antistatic circuit, a second area including a fanout line, a third area including a demultiplexer, and a fourth area including a pixel circuit. The fourth area may include a first sub-area adjacent to at least one of the first to third areas, and a second sub-area excluding the first sub-area. At least the second sub-area may include first pixels disposed in a first direction in a first pixel row, second pixels disposed in the first direction in a second pixel row that may be a next row of the first pixel row, the second pixels being spaced apart from the first pixels, a clock line extending in a second direction intersecting the first direction, and a gate driver including a first stage disposed left of the clock line in a plan view, and a second stage disposed right of the clock line in a plan view.

The second sub-area may include unit pixel rows including the first pixel row and the second pixel row. The first stage and the second stage may be disposed between two adjacent unit pixel rows in the second direction.

The first stage and the second stage may be provided in plural. One of the first stages and one of the second stages may be disposed between the two adjacent unit pixel rows.

The one of the first stages and the one of the second stages may be disposed between the second pixel row of a first unit pixel row and the first pixel row of a second unit pixel row, among the two adjacent unit pixel rows.

A gap between the first stage and the clock line in the first direction and a gap between the second stage and the clock line in the first direction may be same.

The first stage and the second stage may be symmetrically positioned with respect to the clock line in a plan view.

The first stage may be electrically connected to the first pixels, and the second stage may be electrically connected to the second pixels.

The first stage may be electrically connected to the second pixels, and the second stage may be electrically connected to the first pixels.

The clock line may include a first clock line and a second clock line that extend in the second direction and may be spaced apart from each other in the first direction, and the first stage and the second stage may be electrically connected to the first and second clock lines through a conductive pattern.

The conductive pattern may include a first conductive pattern that electrically connects the first stage and the first clock line, a second conductive pattern that electrically connects the first stage and the second clock line, a third conductive pattern that electrically connects the second stage and the first clock line, and a fourth conductive pattern that electrically connects the second stage and the second clock line. The first and second clock lines and the first to fourth conductive patterns may be provided on different layers.

The first and second clock lines may be disposed on the first to fourth conductive patterns with an insulating layer therebetween, the first clock line may be electrically connected to the first conductive pattern through a first contact hole of the insulating layer, the second clock line may be electrically connected to the second conductive pattern through a second contact hole of the insulating layer, the first clock line may be electrically connected to the third conductive pattern through a third contact hole of the insulating layer, and the second clock line may be electrically connected to the fourth conductive pattern through a fourth contact hole of the insulating layer.

Each of the first pixels and each of the second pixels may include a display element layer including a light emitting element, and a pixel circuit layer that includes the pixel circuit electrically connected to the light emitting element, and a power line electrically connected to the pixel circuit. The display element layer may further include a first electrode and a second electrode that may be electrically connected to the light emitting element and may be spaced apart from each other. At least one of the first electrode and the second electrode may be electrically connected to the pixel circuit, and another of the first electrode and the second electrode may be electrically connected to the power line.

The pixel circuit may not be disposed in the first to third areas. The light emitting element may be disposed in at least two of the first to third areas.

At least two of the light emitting elements disposed in the at least two areas may be electrically connected to the pixel circuit disposed in the first sub-area.

The light emitting element may include a flip chip type of micro light emitting diode.

The display device may further include a bank disposed adjacent to the light emitting element. The bank may include a light blocking material.

The substrate may include a first surface on which the light emitting element may be disposed, a second surface facing the first surface, and a side surface between the first surface and the second surface to be continuous to the first surface and the second surface. A pad portion and a side connecting wire surrounding the pad portion, the side surface, and the second surface may be disposed in the non-display area.

The substrate may further include a chamfered portion formed between the first surface and the side surface. The side connecting wire may entirely surround the chamfered portion.

The display device may further include a cover layer overlapping the first surface of the substrate, an intermediate layer disposed between the cover layer and the first surface to couple the cover layer and the substrate, and a flexible film disposed on the second surface of the substrate and electrically connected to the side connecting wire through a conductive member. The cover layer may protrude outward from the side surface of the substrate.

A tiled display device according to an embodiment may include display devices disposed in a matrix format. Each of the display devices may include a substrate that includes a display area and a non-display area disposed at least at a side of the display area, the substrate being made of glass. The display area may include a first area including an antistatic circuit, a second area including a fanout line, a third area including a demultiplexer, and a fourth area including a pixel circuit. The fourth area may include a first sub-area adjacent to at least one of the first to third areas, and a second sub-area excluding the first sub-area. At least the second sub-area may include first pixels disposed in a first direction in a first pixel row, second pixels disposed in the first direction in a second pixel row that may be a next row of the first pixel row, the second pixels being spaced apart from the first pixels, a clock line extending in a second direction intersecting the first direction, and a gate driver including a first stage disposed left of the clock line in a plan view, and a second stage disposed right of the clock line in a plan view.

According to an embodiment of the disclosure, it may be possible to increase freedom of arrangement of a gate driver regardless of an increase in resolution to secure an integrated space of the gate driver, by disposing a first stage at a left side of a clock line (or a clock signal line) and a second stage at a right side thereof between two adjacent unit pixel rows.

In addition, according to an embodiment of the disclosure, as one first stage and one second stage may be disposed between two adjacent unit pixel rows, an integrated space of a pixel circuit due to an increase in resolution may be secured.

In addition, according to an embodiment of the disclosure, it may be possible to form a more natural screen, by designing a pixel pitch between adjacent display devices (or display panels) to be the same as a pixel pitch within the display device to minimize a non-display area between the display devices to reduce the sense of disconnection between multiple display devices.

Effects according to an embodiment of the disclosure are not limited by what is illustrated in the above, and additional various effects are included in the specification.

DETAILED DESCRIPTION OF THE EMBODIMENTS

Figure 1:
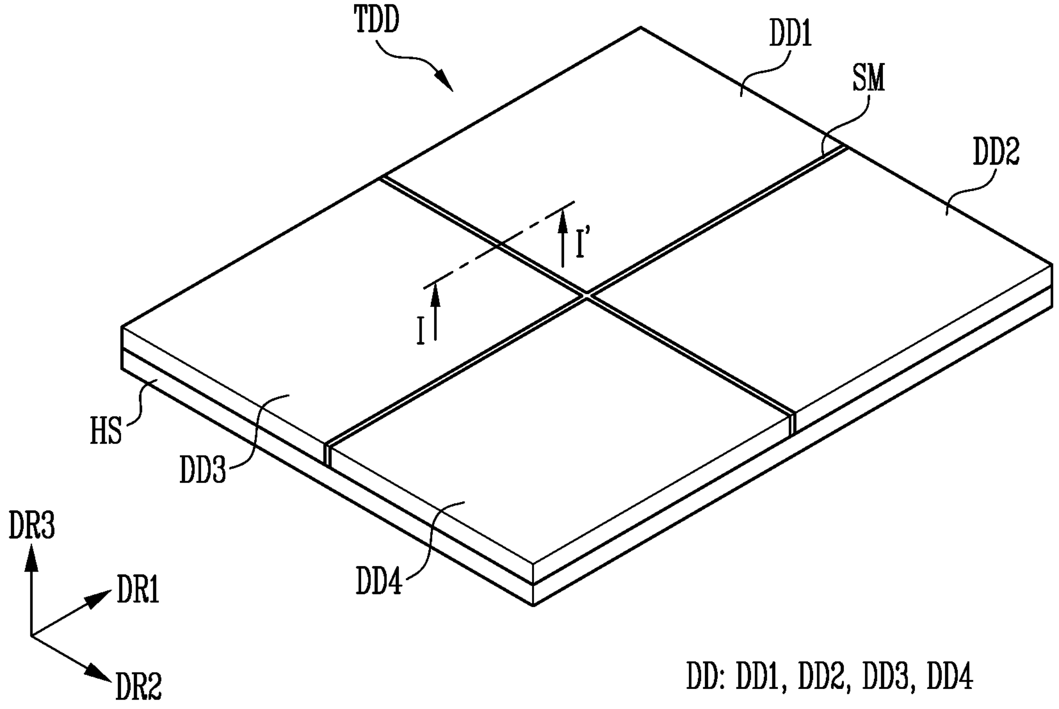
FIG. 1 illustrates a schematic perspective view of a tiled display device according to an embodiment.

Since the disclosure may be variously modified and have various forms, only specific embodiments can be illustrated and described in detail in the following. This disclosure, however, by no means is restricted to the specific embodiments, and it is to be understood as embracing all changes, equivalents, and substitutes included in the spirit and scope of the disclosure.

Like reference numerals are used for like constituent elements in describing each drawing. In the accompanying drawings, the dimensions of the structure may be exaggerated and shown for clarity of the disclosure. Terms such as first, second, and the like will be used only to describe various constituent elements, and are not to be interpreted as limiting these constituent elements. The terms are only used to differentiate one constituent element from other constituent elements. For example, a first constituent element could be termed a second constituent element, and similarly, a second constituent element could be termed as a first constituent element, without departing from the scope of the disclosure.

In the application, it should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. It will be understood that when an element such as a layer, film, region, area, or substrate is referred to as being "on" another element, it can be directly on the other element or intervening elements may also be present. In addition, in the specification, when an element of a layer, film, region, area, plate, or the like is referred to as being formed "on" another element, the formed direction is not limited to an upper direction but includes a lateral or lower direction. When an element of a layer, film, region, area, plate, or the like is referred to as being "below" another element, it may be directly below the other element, or intervening elements may be present.

It is to be understood that, in the application, when it is described for one constituent element (for example, a first constituent element) to be (functionally or communicatively) "coupled or connected with/to" another constituent element (for example, a second constituent element), the one constituent element may be directly coupled or connected with/to the another constituent element, or may be coupled or connected with/to through the other constituent element (for example, a third constituent element). In contrast, it is to be understood that when it is described for one constituent element (for example, a first constituent element) to be "directly coupled or connected with/to" another constituent element (for example, a second constituent element), there may be no other constituent element (for example, a third constituent element) between the one constituent element and the another constituent element.

In the description below, singular forms are to include plural forms unless the context clearly indicates only the singular.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
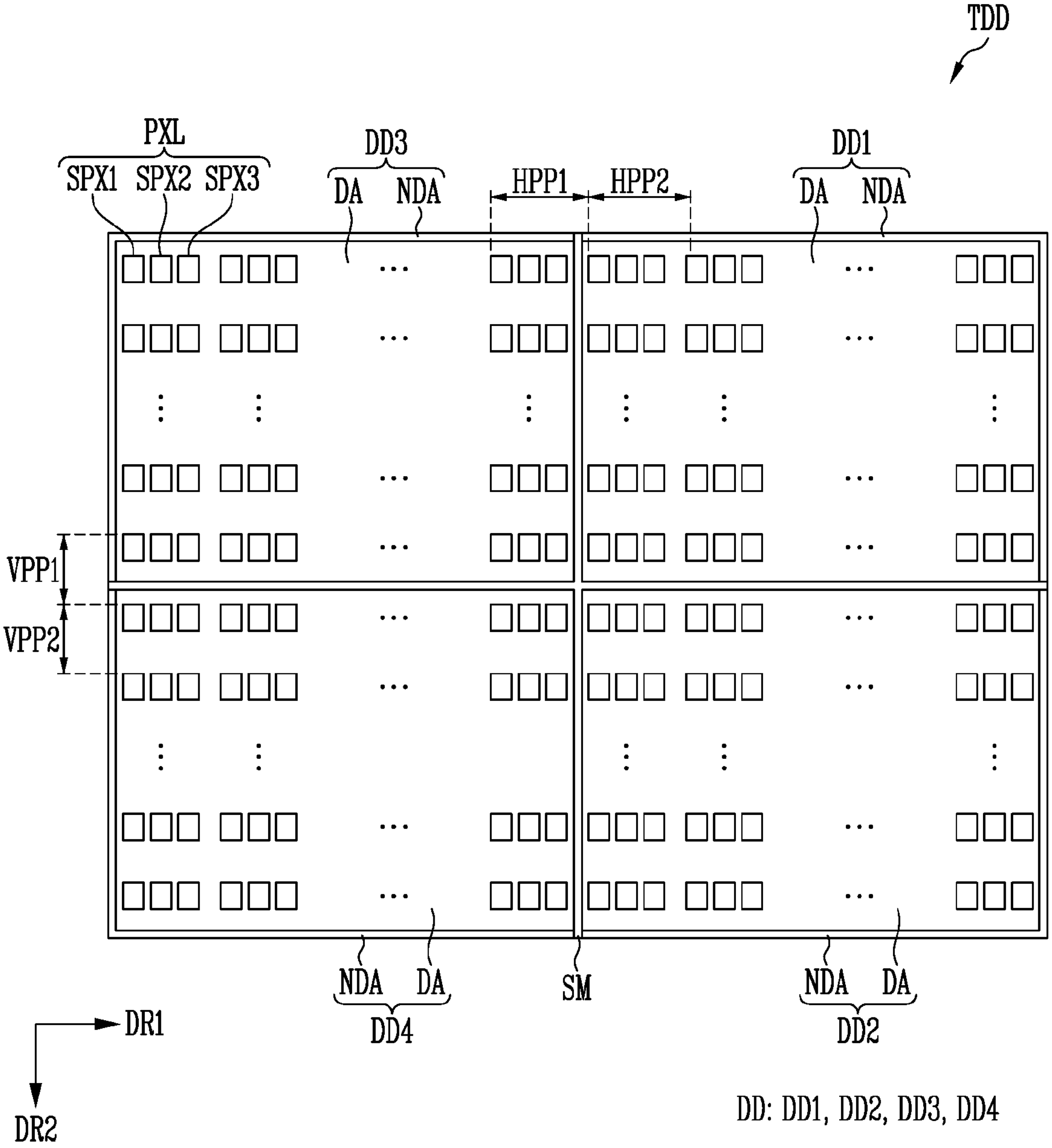
FIG. 2 schematically illustrates a tiled display device according to an embodiment.

FIG. 1 illustrates a schematic perspective view of a tiled display device TDD according to an embodiment, and FIG. 2 schematically illustrates the tiled display device TDD according to an embodiment.

Referring to FIG. 1 and FIG. 2, the tiled display device TDD according to an embodiment may realize a multi-screen display device including multiple display devices DD.

In case that the display device DD is one in which a display surface is applied to at least a surface thereof such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, the disclosure may be applied thereto.

The tiled display device TDD may include multiple display devices DD arranged in a matrix format along a first direction DR1 and a second direction DR2, and a housing HS.

The display devices DD may display individual images, or may divide and display one image. The display devices DD may include, for example, a first display device DD1, a second display device DD2, a third display device DD3, and a fourth display device DD4.

The first to fourth display devices DD1, DD2, DD3, and DD4 may be disposed side by side so that respective display surfaces (or image display surfaces) on which an image may be displayed face a direction. The first to fourth display devices DD1, DD2, DD3, and DD4 may have the same size (or area), but are not limited thereto. In some embodiments, each of the first to fourth display devices DD1, DD2, DD3, and DD4 may have a size (or area) different from that of adjacent display devices to meet a design condition of the applied tiled display device TDD.

Each of the first to fourth display devices DD1, DD2, DD3, and DD4 may be provided in various shapes, and as an example, may be provided in a rectangular shape plate having two pairs of sides parallel to each other, but embodiments are not limited thereto. In case that each of the first to fourth display devices DD1, DD2, DD3, and DD4 is provided in the rectangular shape plate, one of the two pairs of sides may be provided to be longer than another pair of sides. In FIG. 1 and FIG. 2, for better understanding and ease of description, a case in which each of the first to fourth display devices DD1, DD2, DD3, and DD4 has a rectangular shape with a pair of long sides and a pair of short sides is illustrated, and an extending direction of the long side may be indicated as the first direction DR1, an extending direction of the short side may be indicated as the second direction DR2, and a direction vertical to the extending directions of the long and short sides may be indicated as the third direction DR3. Each of the first to fourth display devices DD1, DD2, DD3, and DD4 provided in the rectangular plate shape may have a round shape at a corner where one long side and one short side meet, but embodiments are not limited thereto.

The first to fourth display devices DD1, DD2, DD3, and DD4 may be arranged in a matrix format. The matrix format may include at least one row and at least two columns.

The housing HS may physically combine the first to fourth display devices DD1, DD2, DD3, and DD4 so that the first to fourth display devices DD1, DD2, DD3, and DD4 may form a tiled display device TDD. The housing HS may be disposed on a surface (or lower surface) of the first to fourth display devices DD1, DD2, DD3, and DD4 to control or fix movement of the first to fourth display devices DD1, DD2, DD3, and DD4. Each of the first to fourth display devices DD1, DD2, DD3, and DD4 may be detachably fastened to the housing HS through at least one fastening member (not shown). Accordingly, since it may be possible to attach and detach each of the first to fourth display devices DD1, DD2, DD3, and DD4 from the housing HS, in case that one of the first to fourth display devices DD1, DD2, DD3, and DD4 is defective, it may be easily repaired.

The first to fourth display devices DD1, DD2, DD3, and DD4 may have substantially similar or same structure. For example, the first to fourth display devices DD1, DD2, DD3, and DD4 may include a display area DA and a non-display area NDA. The display area DA may include pixels PXL to display an image. Each of the pixels PXL may include first to third sub-pixels SPX1, SPX2, and SPX3.

Each of the first to third sub-pixels SPX1, SPX2, and SPX3 may include an organic light emitting diode including an organic light emitting layer, a quantum dot LED including a quantum dot light emitting layer, an inorganic LED including an inorganic semiconductor, and a micro LED. The non-display area NDA may be disposed around the display area DA to surround the display area DA, and may not display an image.

The display device DD may include the first to third sub-pixels SPX1, SPX2, and SPX3 arranged along rows and columns in the display area DA. Each of the first to third sub-pixels SPX1, SPX2, and SPX3 may include a light emitting area (or opening area) defined by a bank (or pixel defining film), and may emit light having a predetermined peak wavelength through the light emitting area. The light emitting area may be an area in which light generated by a light emitting element disposed in the display device DD may be emitted to the outside of the display device DD. The first sub-pixel SPX1 may emit light of a first color, the second sub-pixel SPX2 may emit light of a second color, and the third sub-pixel SPX3 may emit light of a third color. For example, the light of the first color may be red light having a peak wavelength in a range of 610 nm to 650 nm, the light of the second color may be green light having a peak wavelength in a range of 510 nm to 550 nm, and the light of the third color may be blue light having a peak wavelength in a range of 440 nm to 480 nm, but embodiments are not limited thereto.

The first to third sub-pixels SPX1, SPX2, and SPX3 may be sequentially and repeatedly disposed along the first direction DR1 of the display area DA. Areas of respective light emitting areas of the first to third sub-pixels SPX1, SPX2, and SPX3 may be substantially the same, but are not limited thereto. In some embodiments, the area (or size) of the light emitting area of the third sub-pixel SPX3 may be larger than the area of the light emitting area of the first sub-pixel SPX1, and the area of the light emitting area of the first sub-pixel SPX1 may be larger than the area of the light emitting area of the second sub-pixel SPX2, but is not limited thereto.

The tiled display device TDD may have an overall flat area shape, but is not limited thereto. The tiled display device TDD may provide a stereoscopic effect to a user by having a three-dimensional shape. For example, when the tiled display device TDD has the three-dimensional shape, at least some of the display devices DD may have a curved shape. As another example, the display devices DD may respectively have a flat shape, and may be connected to each other at a predetermined angle, so that the tiled display device TDD may have a three-dimensional shape.

The tiled display device TDD may include a coupling area SM disposed between multiple display areas DA. The tiled display device TDD may be formed by respectively connecting the non-display areas NDA of the adjacent display devices DD. The display devices DD may be connected to each other through a coupling member or an adhesive member disposed in the coupling area SM. The coupling area SM of each of the display devices DD may not include a pad portion or a flexible film attached to the pad portion. A distance between the display areas DA of the display devices DD may be so close that the coupling area SM between the display devices DD may be not recognized by a user. For example, a first horizontal pixel pitch HPP1 between the pixels PXL of the first display device DD1 and the pixels PXL of the third display device DD3 may be substantially the same as a second horizontal pixel pitch HPP2 between the pixels PXL of the first display device DD1. A first vertical pixel pitch VPP1 between the pixels PXL of the third display device DD3 and the pixels PXL of the fourth display device DD4 may be substantially the same as a second vertical pixel pitch VPP2 between the pixels PXL of the fourth display device DD4. Accordingly, the tiled display device TDD may prevent the coupling area SM between the display devices DD from being recognized by the user, thereby improving (e.g., minimizing) the sense of disconnection between the display devices DD and improving immersion of an image.

Figure 3A:
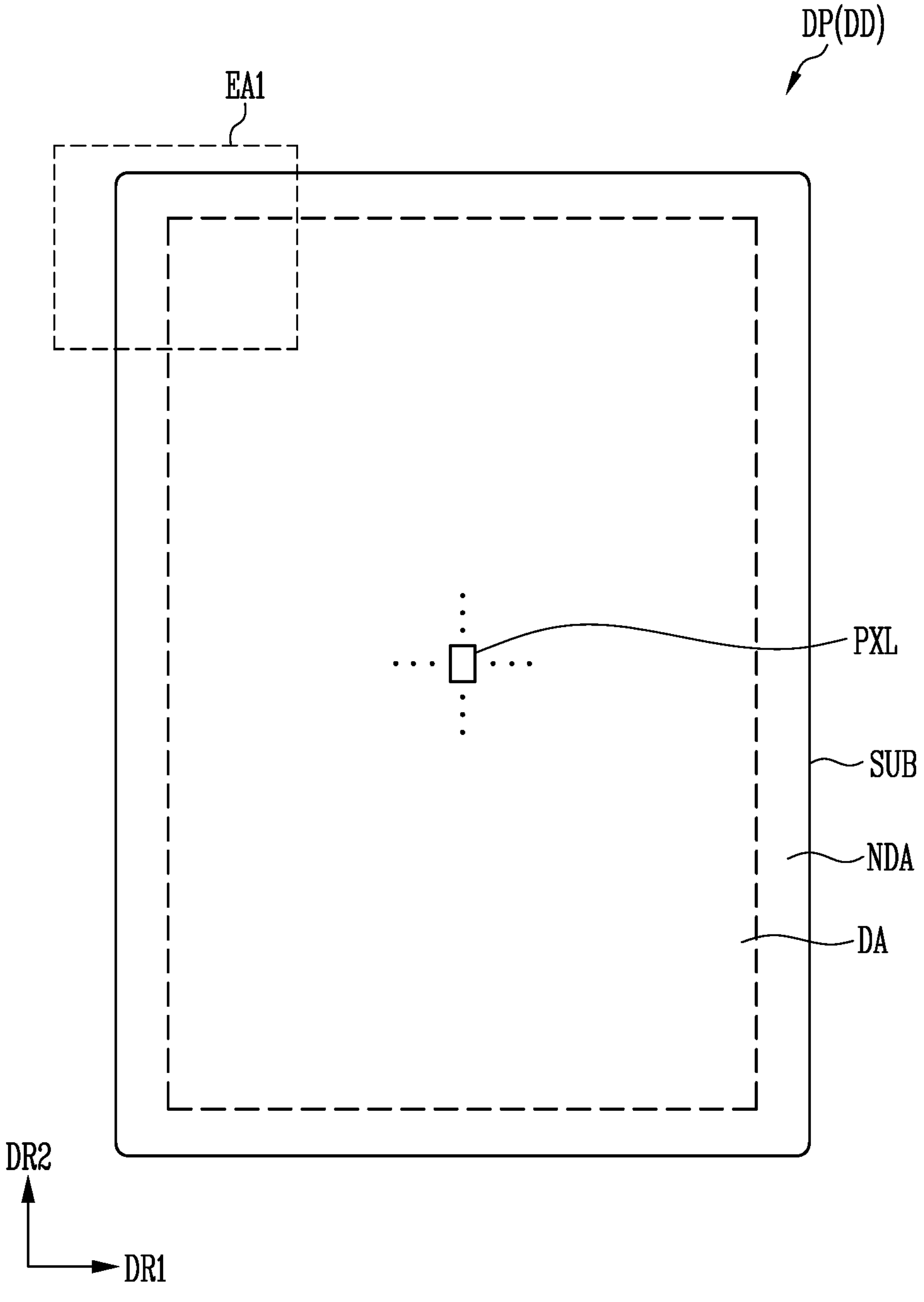
FIG. 3A schematically illustrates a display panel of a display device according to an embodiment.
Figure 3B:
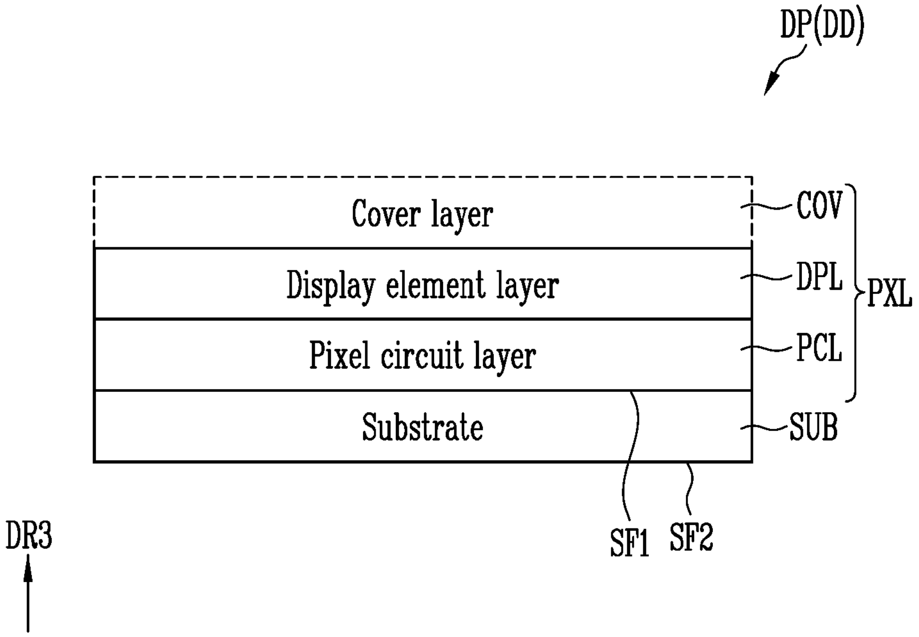
FIG. 3B illustrates a schematic cross-sectional view of the display panel of FIG. 3A.

FIG. 3A schematically illustrates a display panel DP of a display device DD according to an embodiment, and FIG. 3B illustrates a schematic cross-sectional view of the display panel DP of FIG. 3A.

In FIG. 3A and FIG. 3B, for better understanding and ease of description, a structure of the display device DD, particularly, of the display panel DP provided in the display device DD is briefly illustrated based on the display area DA in which an image may be displayed.

For better understanding and ease of description, in FIG. 3A, a horizontal direction in a plan view may be indicated as the first direction DR1, a vertical direction in a plan view may be indicated as the second direction DR2, and in FIG. 3B, a vertical direction in a cross-sectional view (or a thickness direction of the substrate SUB) may be indicated as the third direction DR3.

Referring to FIG. 1, FIG. 2, FIG. 3A, and FIG. 3B, the display panel DP (or the display device DD) may include the pixels PXL that may be disposed on the substrate SUB and in the display area DA.

The substrate SUB may be formed of an area having an approximately rectangular shape. However, the number of areas provided in the substrate SUB may vary, and the shape of the substrate SUB may have a different shape depending on the area provided in the substrate SUB. The substrate SUB may include a first surface SF1 and a second surface SF2 facing each other in the third direction DR3.

The substrate SUB may be made of an insulating material such as glass or a resin. In addition, the substrate SUB may be made of a flexible material to be bendable or foldable, and may have a single-layered structure or a multi-layered structure. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material included in the substrate SUB is not limited to the above-described embodiment. In an embodiment, the substrate SUB may be made of a glass material.

The substrate SUB (or the display panel DP) may include the display area DA and the non-display area NDA. The display area DA may be an area in which pixels PXL may be provided to display an image, and the non-display area NDA may be an area in which the pixels PXL may not be provided and no image may be displayed.

The pixels PXL may be provided in the display area DA of the substrate SUB. The pixels PXL may include a light emitting element emitting color light. Each of the pixels PXL may emit light of one of red, green and blue colors, but is not limited thereto.

Each of the pixels PXL may include a pixel circuit layer PCL disposed on the substrate SUB and a display element layer DPL disposed on the pixel circuit layer PCL. In addition, each of the pixels PXL may selectively include a cover layer COV disposed on the display element layer DPL.

The pixel circuit layer PCL may be positioned on the first surface SF1 of the substrate SUB. In the pixel circuit layer PCL, a pixel circuit (refer to "PXC" in FIG. 4) that may be provided on the substrate SUB and may include transistors, and signal wires and power lines connected to the transistors. Each transistor may have, for example, a structure in which a semiconductor pattern and a gate electrode may be stacked on each other with an insulating layer interposed therebetween. The semiconductor layer may include an amorphous silicon, a poly silicon, a low temperature poly silicon, an organic semiconductor, and/or an oxide semiconductor. The gate electrode may include at least one of aluminum (Al), copper (Cu), titanium (Ti), and molybdenum (Mo), but is not limited thereto. In addition, the pixel circuit layer PCL may include at least one insulating layer.

The display element layer DPL may be disposed on the pixel circuit layer PCL. A light emitting portion (refer to "EMU" in FIG. 4) including a light emitting element emitting light may be positioned on the display element layer DPL.

The cover layer COV may be selectively disposed on the display element layer DPL.

The cover layer COV may be provided to cover the display element layer DPL to protect the display element layer DPL from external impact. The cover layer COV may absorb light irradiated to the coupling area SM or light reflected on the bonding area SM while preventing the coupling area SM between adjacent display devices DD from being viewed, so that the recognition of the coupling area SM may be minimized.

In the following embodiment, for better understanding and ease of description, a horizontal direction in a plan view may be indicated as the first direction DR1, a vertical direction in a plan view may be indicated as the second direction DR2, and a vertical direction in a cross-sectional view may be indicated as the third direction DR3.

Figure 4:
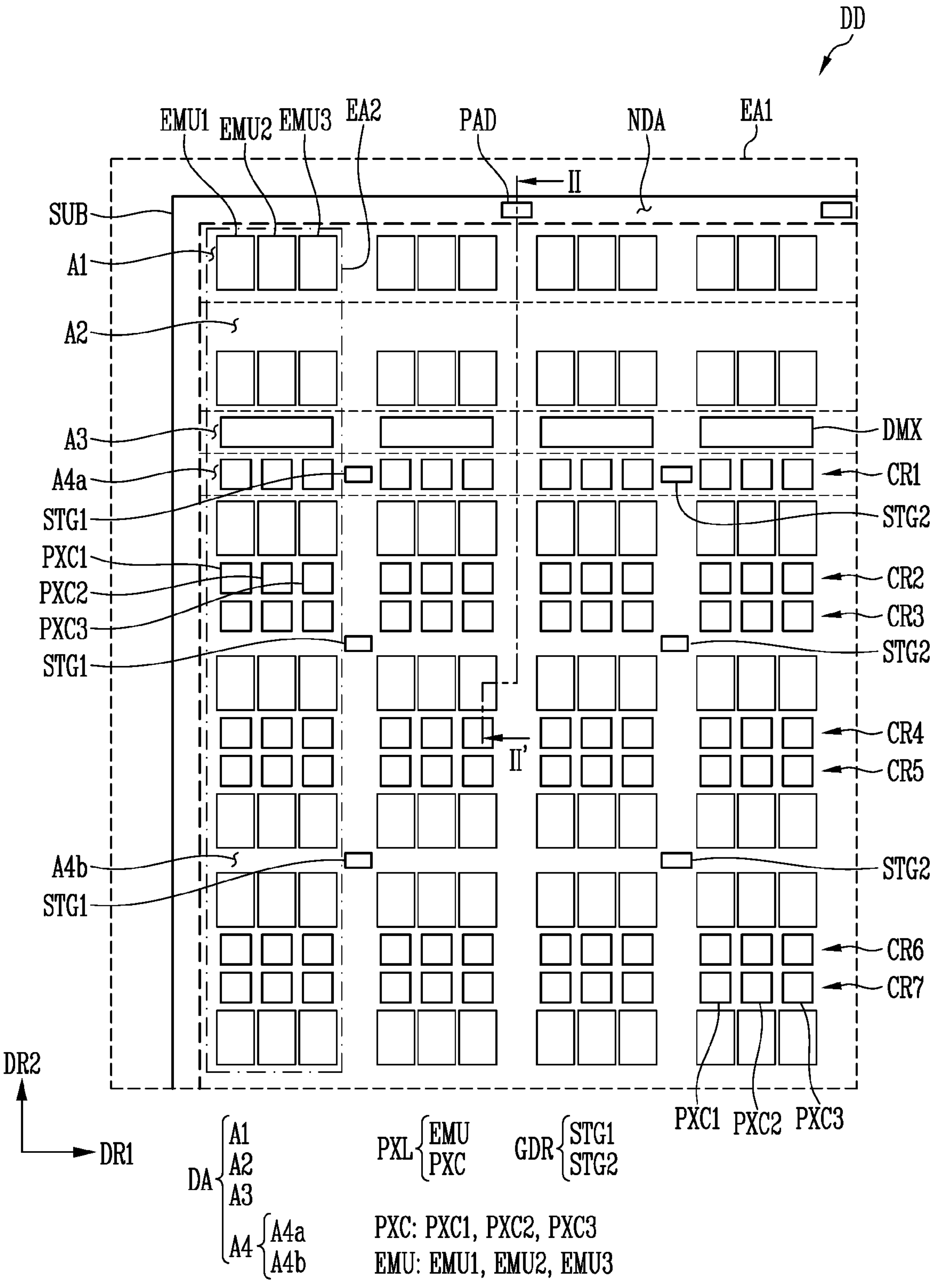
FIG. 4 illustrates a schematic enlarged view of a portion 'EA1' of FIG. 3A.
Figure 5:
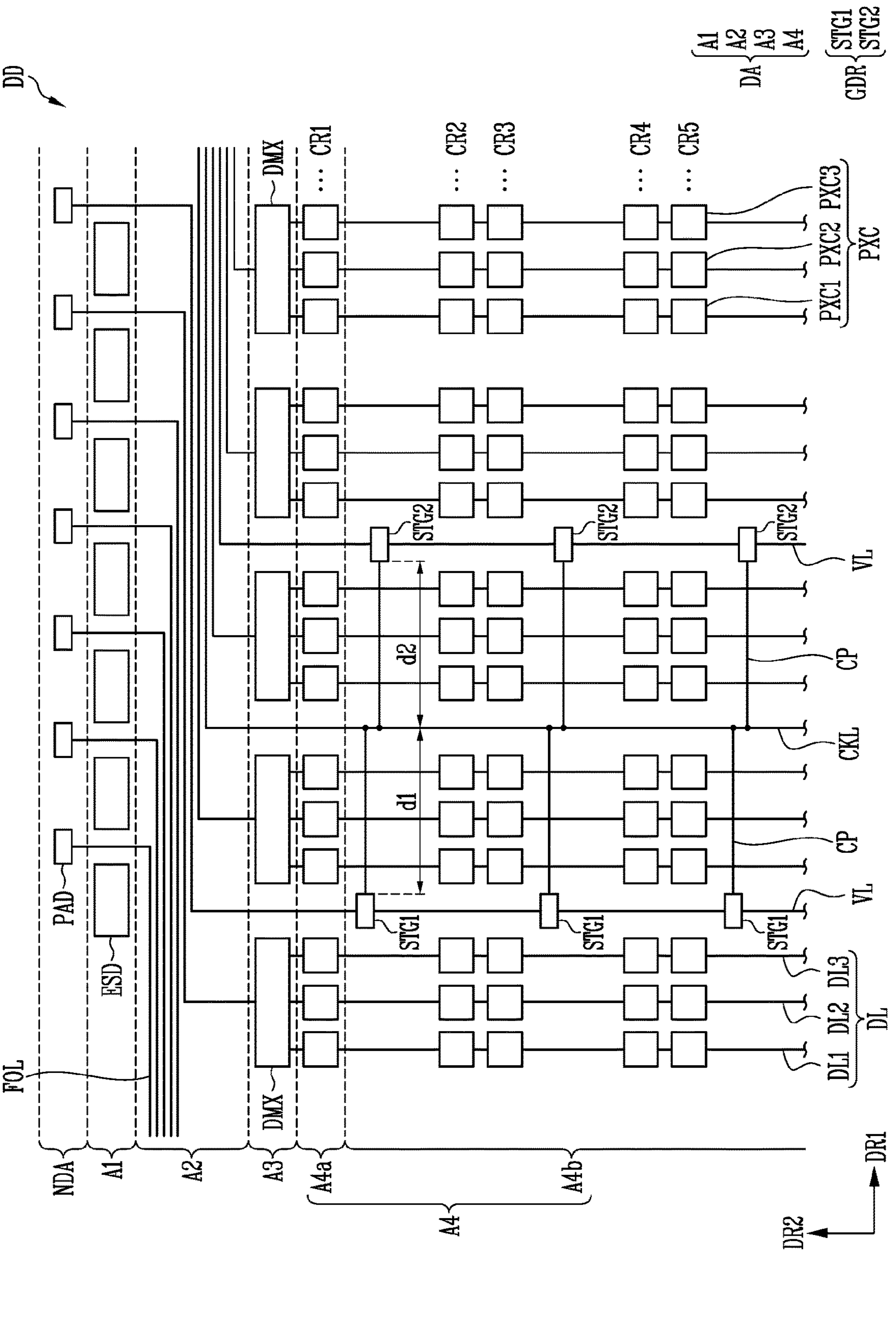
FIG. 5 schematically illustrates a first area, a second area, a third area, a fourth area, and a non-display area in a display device according to an embodiment.
Figure 6:
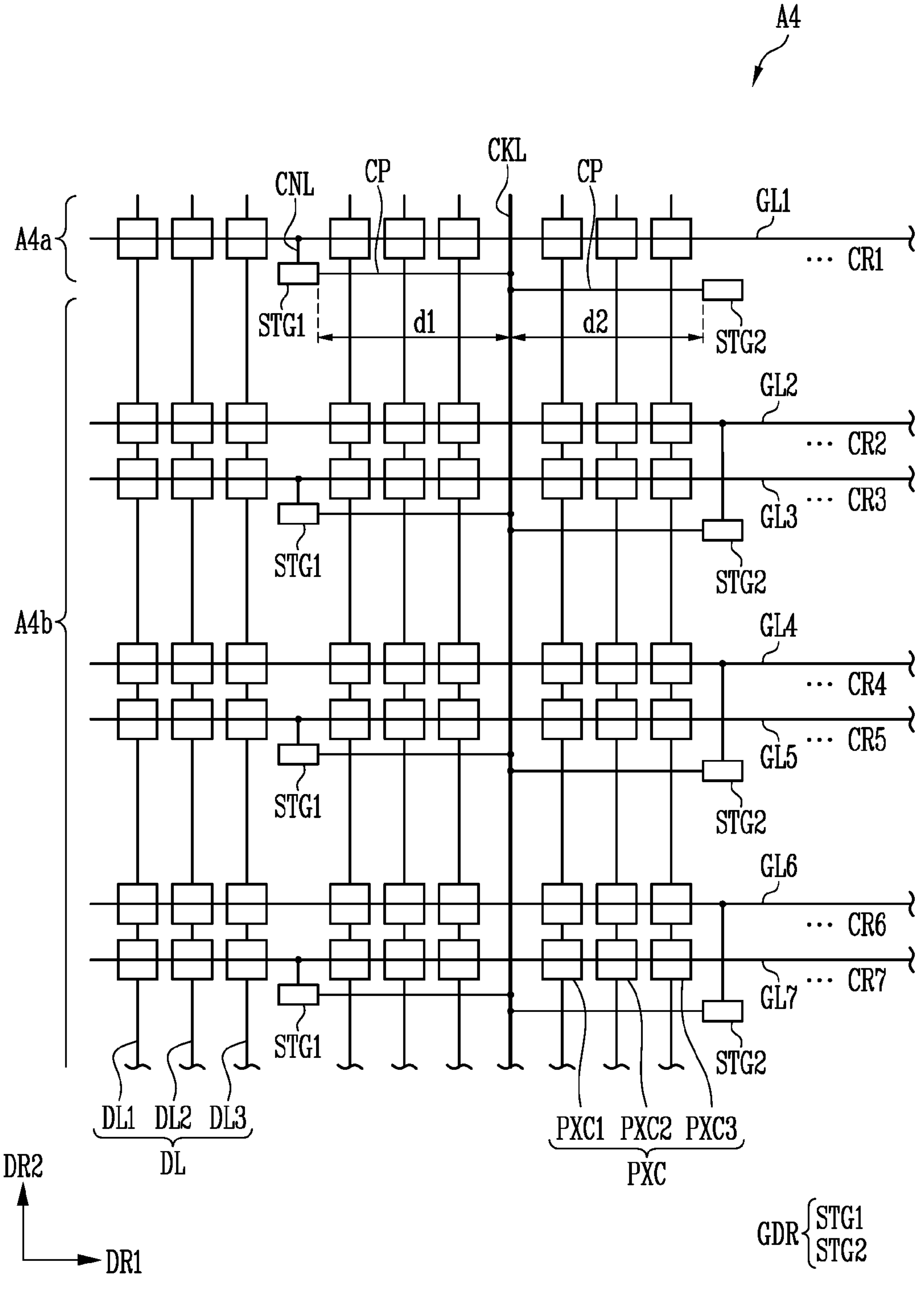
FIG. 6 schematically illustrates a connection relationship between a pixel circuit and a gate driver in a fourth area of a display device according to an embodiment.
Figure 7:
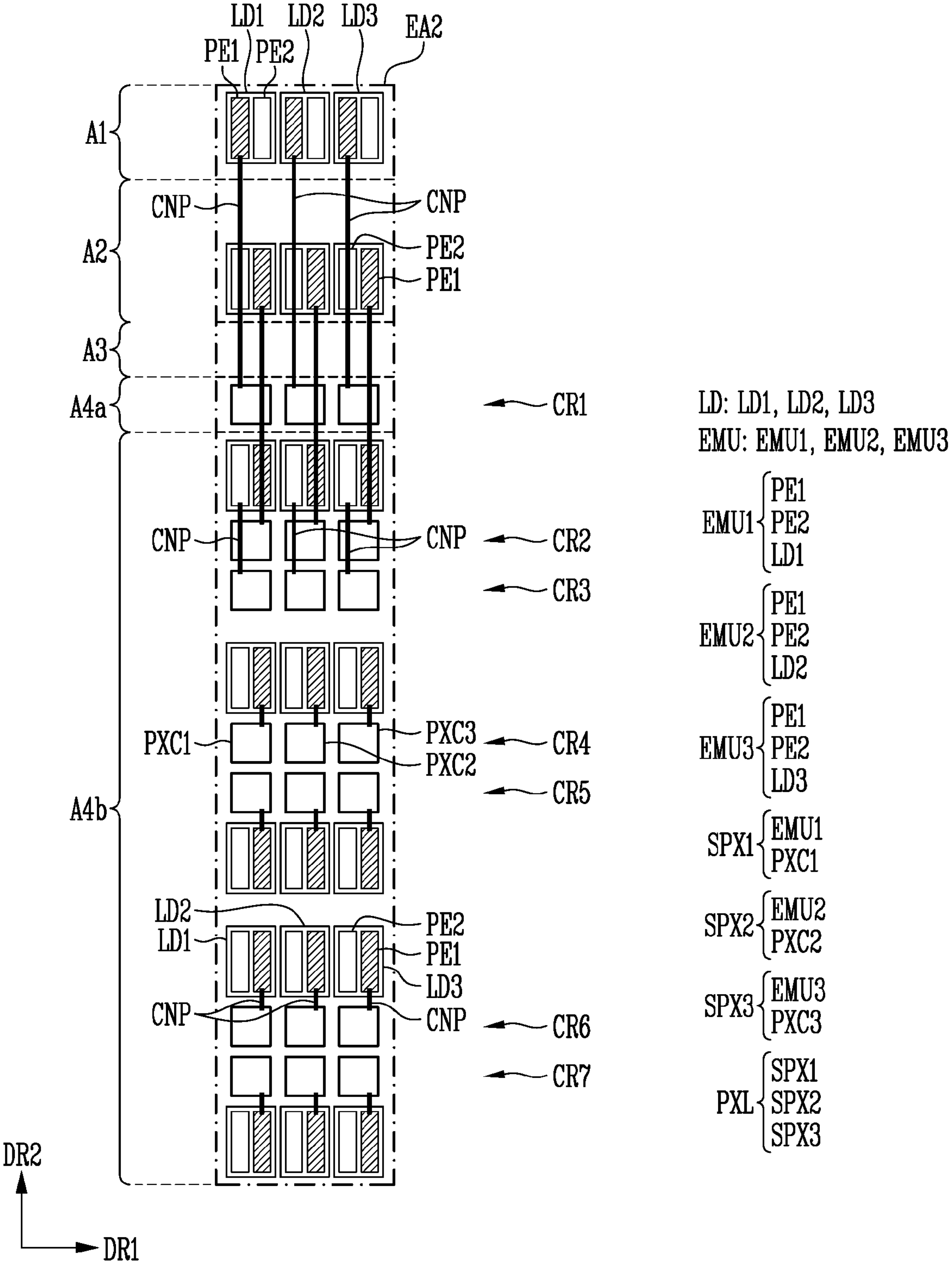
FIG. 7 illustrates a schematic enlarged view of a portion 'EA2' of FIG. 4.
Figure 8:
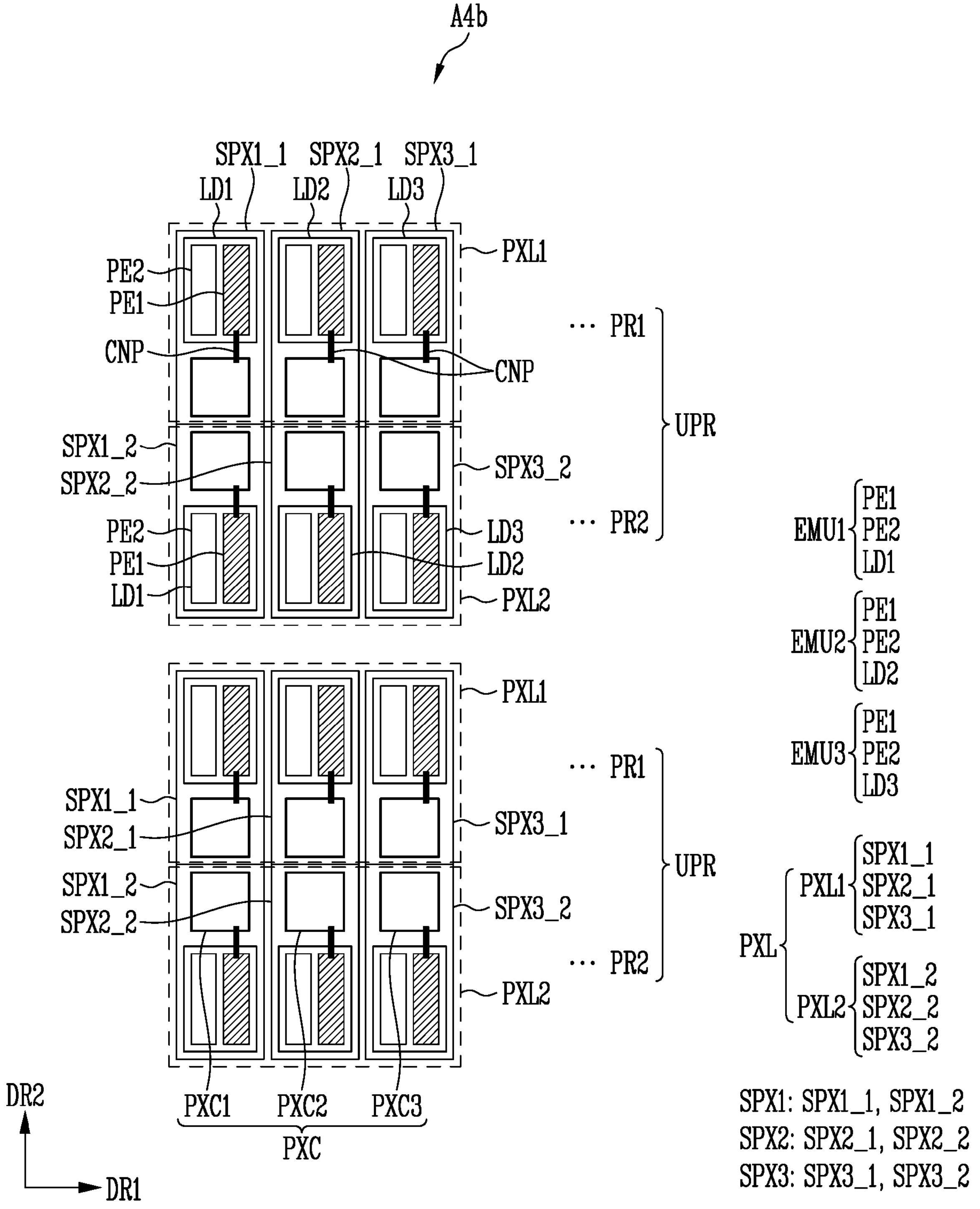
FIG. 8 schematically illustrates a portion of a second sub-area of a display device according to an embodiment.

FIG. 4 illustrates a schematic enlarged view of a portion 'EA1' of FIG. 3A. FIG. 5 schematically illustrates a first area A1, a second area A2, a third area A3, a fourth area A4, and the non-display area NDA in the display device DD according to an embodiment. FIG. 6 schematically illustrates a connection relationship between a pixel circuit PXC and a gate driver GDR in a fourth area A4 of the display device DD according to an embodiment. FIG. 7 illustrates a schematic enlarged view of a portion 'EA2' of FIG. 4. FIG. 8 schematically illustrates a portion A4*b* of a second sub-area of a display device according to an embodiment.

Referring to FIG. 1 to FIG. 8, the display device DD may include the display area DA and the non-display area NDA.

The display area DA may include the first area A1, the second area A2, the third area A3, and the fourth area A4 sequentially positioned along the second direction DR2. For example, the display area DA may be partitioned into the first area A1, the second area A2, the third area A3, and the fourth area A4. The first area A1, the second area A2, and the third area A3 may be disposed at an edge (for example, an upper edge) of the display area DA, but embodiments are not limited thereto. In some embodiments, the first area A1, the second area A2, and the third area A3 may all be disposed at a lower edge, left and right edges, or upper and lower edges of the display area DA.

The non-display area NDA may include a pad portion PAD. For example, the pad portion PAD may be disposed in the non-display area NDA.

At least one antistatic circuit ESD may be disposed in the first area A1, at least one fan-out line FOL may be disposed in the second area A2, at least one demultiplexer DMX may be disposed in the third area A3, and at least one pixel circuit PXC may be disposed in the fourth area A4.

The antistatic circuit ESD may protect the fanout line FOL, the demultiplexer DMX, and the pixel circuit PXC from static electricity. The antistatic circuit ESD may suppress a pulse potential caused by static electricity from being introduced to an internal circuit, for example, the demultiplexer DMX and the pixel circuit PXC.

The fan-out line FOL may extend from the pad portion PAD to the demultiplexer DMX. The fan-out line FOL may supply a data signal received from the pad portion PAD to the demultiplexer DMX. The fan-out line FOL may extend from the pad portion PAD to the fourth area A4. The fan-out line FOL may supply a clock signal received from the pad portion PAD to a clock line CKL, and may supply a power voltage or a control voltage received from the pad portion PAD to a voltage line VL.

The fourth area A4 may include a data line DL, the clock line CKL, and the voltage line VL. For example, the data line DL, the clock line CKL, and the voltage line VL may be disposed in the fourth area A4.

The data line DL may be connected between the demultiplexer DMX and the pixel circuit PXC. Data lines DL may extend in the second direction DR2, and may be spaced apart from each other in the first direction DR1. The data line DL may supply a data voltage received from the demultiplexer DMX to the pixel circuit PXC. The data line DL may include first to third data lines DL1, DL2, and DL3. The first data line DL1 may be electrically connected to a first pixel circuit PXC1 of each of multiple first sub-pixels SPX1 disposed in the same column to supply a data voltage to the first pixel circuit PXC1. The second data line DL2 may be electrically connected to a second pixel circuit PXC2 of each of multiple second sub-pixels SPX2 disposed in the same column to supply a data voltage to the second pixel circuit PXC2. The third data line DL3 may be electrically connected to a third pixel circuit PXC3 of each of multiple third sub-pixels SPX3 disposed in the same column to supply a data voltage to the third pixel circuit PXC3.

The clock line CKL may extend in the second direction DR2. The clock line CKL may receive a clock signal from the fan-out line FOL to supply the clock signal to the gate driver GDR.

The voltage line VL may extend in the second direction DR2, and may be disposed to be spaced apart from the clock line CKL. The voltage line VL may be electrically connected to first and second stages STG1 and STG2 of the gate driver GDR to supply at least one of a gate high voltage, a gate low voltage, a power voltage, and a control voltage to the first and second stages STG1 and STG2, respectively.

In an embodiment, the fourth area A4 may include a first sub-area A4*a* and a second sub-area A4*b*.

The first sub-area A4*a* may be an area of the fourth area A4 positioned immediately adjacent to at least one of the first to third areas A1, A2, and A3, and the second sub-area A4*b* may be the remaining area of the fourth area A4 excluding the first sub-area A4*a*. For example, the first sub-area A4*a* may be one area of the fourth area A4 positioned closest to the third area A3 among the first to third areas A1, A2, and A3. The pixel circuit PXC may be disposed in the first sub-area A4*a* and the second sub-area A4*b* described above.

In an embodiment, each of the pixels PXL may include pixel circuits PXC. For example, each pixel PXL may include the first, second, and third pixel circuits PXC1, PXC2, and PXC3. In addition, each of the pixels PXL may include light emitting portions EMU electrically connected to the pixel circuits PXC. For example, each pixel PXL may include a first light emitting portion EMU1 electrically connected to the first pixel circuit PXC1, a second light emitting portion EMU2 electrically connected to the second pixel circuit PXC2, and a third light emitting portion EMU3 electrically connected to the third pixel circuit PXC3.

The first pixel circuit PXC1 and the first light emitting EMU3 EMU1 may configure the first sub-pixel SPX1 of each pixel PXL, the second pixel circuit PXC2 and the second light emitting portion EMU2 may configure the second sub-pixel SPX2 of the corresponding pixel PXL, and the third pixel circuit PXC3 and the third light emitting portion EMU3 may configure the third sub-pixel SPXL3 of the corresponding pixel PXL.

Each of the pixel circuits PXC may include at least one transistor, signal wires electrically connected to the transistors, and power lines electrically connected to the transistors. This will be described in detail later with reference to FIG. 9.

Each of the light emitting portions EMU may include a first electrode PE1, a second electrode PE2, and a light emitting element LD. The light emitting element LD may be connected to the first electrode PE1 and the second electrode PE2. In an embodiment, the first electrode PE1 may be electrically connected to the pixel circuit PXC through a connection pattern CNP, and the second electrode PE2 may be electrically connected to the power line. In an embodiment, the first electrode PE1 may be an anode, and the second electrode PE2 may be a cathode.

The light emitting element LD may emit light with luminance corresponding to a driving current supplied through the pixel circuit PXC. For example, during each frame period, the pixel circuit PXC may supply a driving current corresponding to a gray value of the corresponding frame to the light emitting portion EMU. The driving current supplied to the light emitting portion EMU may flow to the light emitting element LD. Accordingly, while the light emitting element LD emits light with a luminance corresponding to the driving current, the light emitting portion EMU may emit light.

In an embodiment, the first light emitting portion EMU1 may include a first electrode PE1, a second electrode PE2, and a first light emitting element LD1. The first light emitting element LD1 may be a light emitting diode emitting light of the first color. The second light emitting portion EMU2 may include a first electrode PE1, a second electrode PE2, and a second light emitting element LD2. The second light emitting element LD2 may be a light emitting diode emitting light of the second color different from light of the first color. The third light emitting element LD3 may be a light emitting diode that emits light of the third color different from light of the first and second colors. FIG. 7 and FIG. 8 illustrate that one light emitting element LD may be disposed in each of the light emitting portions EMU, but the disclosure is not limited thereto. In some embodiments, each of the light emitting portions EMU may include at least one light emitting element LD. For example, the first light emitting portion EMU may include multiple first light emitting elements LD1, and each of the first light emitting elements LD1 may include a first end portion connected by contacting the first electrode PE1 and a second end portion connected by contacting the second electrode PE2. The second light emitting portion EMU may include multiple second light emitting elements LD2, and each of the second light emitting elements LD2 may include a first end portion connected by contacting the first electrode PE1 and a second end portion connected by contacting the second electrode PE2. The third light emitting portion EMU may include multiple third light emitting elements LD3, and each of the third light emitting elements LD3 may include a first end portion connected by contacting the first electrode PE1 and a second end portion connected by contacting the second electrode PE2.

In an embodiment, the light emitting portions EMU may be disposed in the first area A1, the second area A2, and the fourth area A4. In other words, the light emitting portions EMU may not be disposed in the third area A3.

The light emitting portions EMU positioned in the first area A1 may be electrically connected to the pixel circuit PXC positioned in the first sub-area A4*a* through the connecting pattern CNP. For example, the first electrode PE1 of each of the first to third light emitting portions EMU1, EMU2, and EMU3 positioned in the first area A1 may be electrically connected to the corresponding pixel circuit PXC positioned in the first sub-area A4*a* through the corresponding connecting pattern CNP. The pixel circuits PXC positioned in the first sub-area A4*a* may be arranged in the first direction DR1 along a first circuit row CR1.

The light emitting portions EMU positioned in the second area A2 may be electrically connected to the pixel circuit PXC positioned in the second sub-area A4*b* through the connecting pattern CNP. For example, the first electrode PE1 of each of the first to third light emitting portions EMU1, EMU2, and EMU3 positioned in the second area A2 may be electrically connected to the corresponding pixel circuit PXC positioned in the second sub-area A4*b* through the corresponding connecting pattern CNP. The pixel circuits PXC positioned in the second sub-area A4*b* may be arranged in the first direction DR1 along a second circuit row CR2.

The light emitting portions EMU positioned in the fourth area A4 may be electrically connected to the pixel circuit PXC positioned in the second sub-area A4*b* through the connecting pattern CNP. For example, the first electrode PE1 of each of the first to third light emitting portions EMU1, EMU2, and EMU3 positioned in the fourth area A4 may be electrically connected to the corresponding pixel circuit PXC positioned in the second sub-area A4*b* through the corresponding connecting pattern CNP. The pixel circuits PXC positioned in the second sub-area A4*b* may be arranged in the first direction DR1 along a third circuit row CR3, a fourth circuit row CR4, a fifth circuit row CR5, a sixth circuit row CR6, and a seventh circuit row CR7 that follow the second circuit row CR2. The first, second, third, fourth, fifth, sixth, and seventh circuit rows CR1, CR2, CR3, CR4, CR5, CR6, and CR7 may be sequentially arranged in the fourth area A4 along an opposite direction of the second direction DR2.

The light emitting portions EMU (or pixels PXL) may be arranged to have a uniform pixel pitch. The pixels PXL may be arranged along pixel rows.

In at least second sub-area A4*b*, the pixels PXL may include first pixels PXL1 arranged in the first direction DR1 along a first pixel row PR1 and second pixels PXL2 arranged in the first direction DR1 along a second pixel row PR2. The second pixel row PR2 may be a pixel row following the first pixel row PR1. The pixel circuits PXC of two consecutive pixel rows may be positioned to be adjacent. For example, the pixel circuits PXC disposed in the first pixel row PR1 and the pixel circuits PXC disposed in the second pixel row PR2 may be positioned to be immediately adjacent to each other. However, embodiments are not limited thereto.

Each of the first and second pixels PXL1 and PXL2 may include the first, second, and third sub-pixels SPX1, SPX2, and SPX3. For example, each of the first pixels PXL1 may include a (1-1)-th sub-pixel SPX1_1, a (2-1)-th sub-pixel SPX2_1, and a (3-1)-th sub-pixel SPX3_1. Each of the second pixels PXL2 may include a (1-2)-th sub-pixel SPX1_2, a (2-2)-th sub-pixel SPX2_2, and a (3-2)-th sub-pixel SPX3_2.

In an embodiment, the successive first and second pixel rows PR1 and PR2 may configure one unit pixel row UPR. In other words, a unit pixel row UPR may include the successive first pixel row PR1 and second pixel row PR2.

The gate driver GDR may be disposed in the fourth area A4. The gate driver GDR may supply a gate signal to a gate line connected to the pixel circuits PXC. In an embodiment, the gate driver GDR may be disposed between adjacent two unit pixel rows UPR in the second direction DR2. The gate driver GDR may include, for example, at least one of a scan initializing driver, a scan writing driver, a scan controlling driver, a sweep driver, a PWM driver, and a PAM driver. The gate driver GDR may be connected to the clock line CKL and the voltage line VL in the fourth area A4.

The gate driver GDR may be two-divided and positioned with respect to the clock line CKL. For example, the gate driver GDR may include the first stage STG1 positioned at the left of the clock line CKL and the second stage STG2 positioned at the right of the clock line CKL with respect to the clock line CKL. Each of the first stage STG1 and the second stage STG2 may be electrically connected to the clock line CKL through a conductive pattern CP. First stages STG1, second stages STG2, and clock lines CKL may be provided.

The first stage STG1 and the second stage STG2 may be disposed to be spaced apart from each other in the first direction DR1. In an embodiment, a distance d1 between the clock line CKL and the first stage STG1 in the first direction DR1 may be the same as a distance d2 between the clock line CKL and the second stage STG2. The first stage STG1 and the second stage STG2 may be symmetrically positioned with respect to the clock line CKL in the fourth area A4. However, the disclosure is not limited thereto, and in some embodiments, the distance d1 between the clock line CKL and the first stage STG1 in the first direction DR1 may be different from the distance d2 between the clock line CKL and the second stage STG2. The first stage STG1 and the second stage STG2 may be positioned in the same row in the fourth area A4, but may not be symmetrically positioned with reference to the clock line CKL. In some embodiments, some of the first stages STG1 and some of the second stages STG2 corresponding thereto may be symmetrically positioned with respect to the clock line CKL in the fourth area A4, and the remaining of the first stages STG1 and the remaining second stages STG2 corresponding thereto may not be symmetrically positioned with respect to the clock line CKL in the fourth area A4.

In the first stages STG1, the first stage STG1 positioned closest to at least one of the first to third areas A1, A2, and A3, for example, the third area A3 may be electrically connected to the gate line disposed in the first circuit row CR1. For example, the first stage STG1 may be electrically connected to a first gate line GL1 disposed in the first circuit row CR1 through a corresponding connecting wire CNL to transmit a gate signal to the first gate line GL1. The second stage STG2 disposed to be spaced apart from the first stage STG1 with the clock line CKL interposed therebetween may not be electrically connected to the first gate line GL1 disposed in the first circuit line CR1. In case that a circuit row (for example, a previous circuit row) preceding the first circuit row CR1 is provided, the second stage STG2 may be electrically connected to a gate line disposed in the previous circuit row to transmit a gate signal to the gate line.

In the above-described embodiment, it has been described that the first stage STG1 positioned closest to the third area A3 may be electrically connected to the first gate line GL1, but the disclosure is not limited thereto. In some embodiments, in the second stages STG2, the second stage STG2 positioned closest to at least one of the first to third areas A1, A2, and A3, for example, the third area A3 may be electrically connected to the gate line disposed in the first circuit row CR1. For example, the second stage STG2 may be electrically connected to a first gate line GL1 disposed in the first circuit row CR1 through a corresponding connecting wire CNL to transmit a gate signal to the first gate line GL1. The first stage STG1 disposed to be spaced apart from the second stage STG2 with the clock line CKL interposed therebetween may not be electrically connected to the first gate line GL1 disposed in the first circuit line CR1. In case that a circuit row (for example, a previous circuit row) preceding the first circuit row CR1 is provided, the first stage STG1 may be electrically connected to a gate line disposed in the previous circuit row to transmit a gate signal to the gate line.

A second gate line GL2 disposed in the second circuit row CR2 may be electrically connected to a corresponding second stage STG2 among the second stages STG2 through a corresponding connecting wire CNL.

A third gate line GL3 disposed in the third circuit row CR3 may be electrically connected to a corresponding first stage STG1 among the first stages STG1 through a corresponding connecting wire CNL. The first stage STG1 may be disposed apart from the second stage STG2 electrically connected to the second gate line GL2 based on the clock line CKL (or with the clock line CKL interposed therebetween), in the first direction DR1.

A fourth gate line GL4 disposed in the fourth circuit row CR4 may be electrically connected to a corresponding second stage STG2 among the second stages STG2 through a corresponding connecting wire CNL.

A fifth gate line GL5 disposed in the fifth circuit row CR5 may be electrically connected to a corresponding first stage STG1 among the first stages STG1 through a corresponding connecting wire CNL. The first stage STG1 may be disposed apart from the second stage STG2 electrically connected to the fourth gate line GL4 based on the clock line CKL (or with the clock line CKL interposed therebetween), in the first direction DR1.

A sixth gate line GL6 disposed in the sixth circuit row CR6 may be electrically connected to a corresponding second stage STG2 among the second stages STG2 through a corresponding connecting wire CNL.

A seventh gate line GL7 disposed in the seventh circuit row CR7 may be electrically connected to a corresponding first stage STG1 among the first stages STG1 through a corresponding connecting wire CNL. The first stage STG1 may be disposed apart from the second stage STG2 electrically connected to the sixth gate line GL6 based on the clock line CKL (or with the clock line CKL interposed therebetween), in the first direction DR1.

One first stage STG1 and one second stage STG2 disposed to be spaced apart from each other in the first direction DR1 based on the clock line CKL may be electrically connected to the first and second pixels PXL1 and PXL2 configuring the unit pixel row UPR. For example, the one first stage STG1 may be electrically connected to one pixel PXL of the first and second pixels PXL1 and PXL2, and the one second stage STG2 may be electrically connected to another pixel PXL of the first and second pixels PXL1 and PXL2.

According to the above-described embodiment, by disposing one first stage STG1 at the left side of the clock line CKL and one second stage STG2 at the right side of the clock line CKL between two adjacent unit pixel rows UPR, the degree of integrated freedom of the gate driver GDR may be improved. Accordingly, the integrated space of the gate driver GDR may be further secured.

In addition, according to the above-described embodiment, one gate driver GDR may be disposed between two adjacent unit pixel rows UPR in the display area DA (or the fourth area A4) to each of the first and second pixels PXL1 and PXL2, so that the integrated space of the pixel circuit PXC of each of the first and second pixels PXL1 and PXL2 may be further secured.

In addition, according to an embodiment described above, the first area A1 in which the antistatic circuit ESD may be disposed, the second area A2 in which the fan-out line FOL may be disposed, the third area A3 in which the demultiplexer DMX may be disposed, and the fourth area A4 in which the pixel circuit PXC may be disposed may all be disposed in the display area DA, so that by reducing or minimizing the non-display area NDA, it may be possible to design the pixel pitch between the display devices DD to be the same as the pixel pitch in the display device DD. Accordingly, the tiled display device TDD implemented with the display devices DD minimizes the distance between the adjacent display devices DD, so that it may be possible to improve the immersion of the image by preventing a user from recognizing the coupling area SM between adjacent display devices DD and improving (e.g., minimizing) a sense of disconnection between the display devices DD to realize a more natural image.

Figure 9:
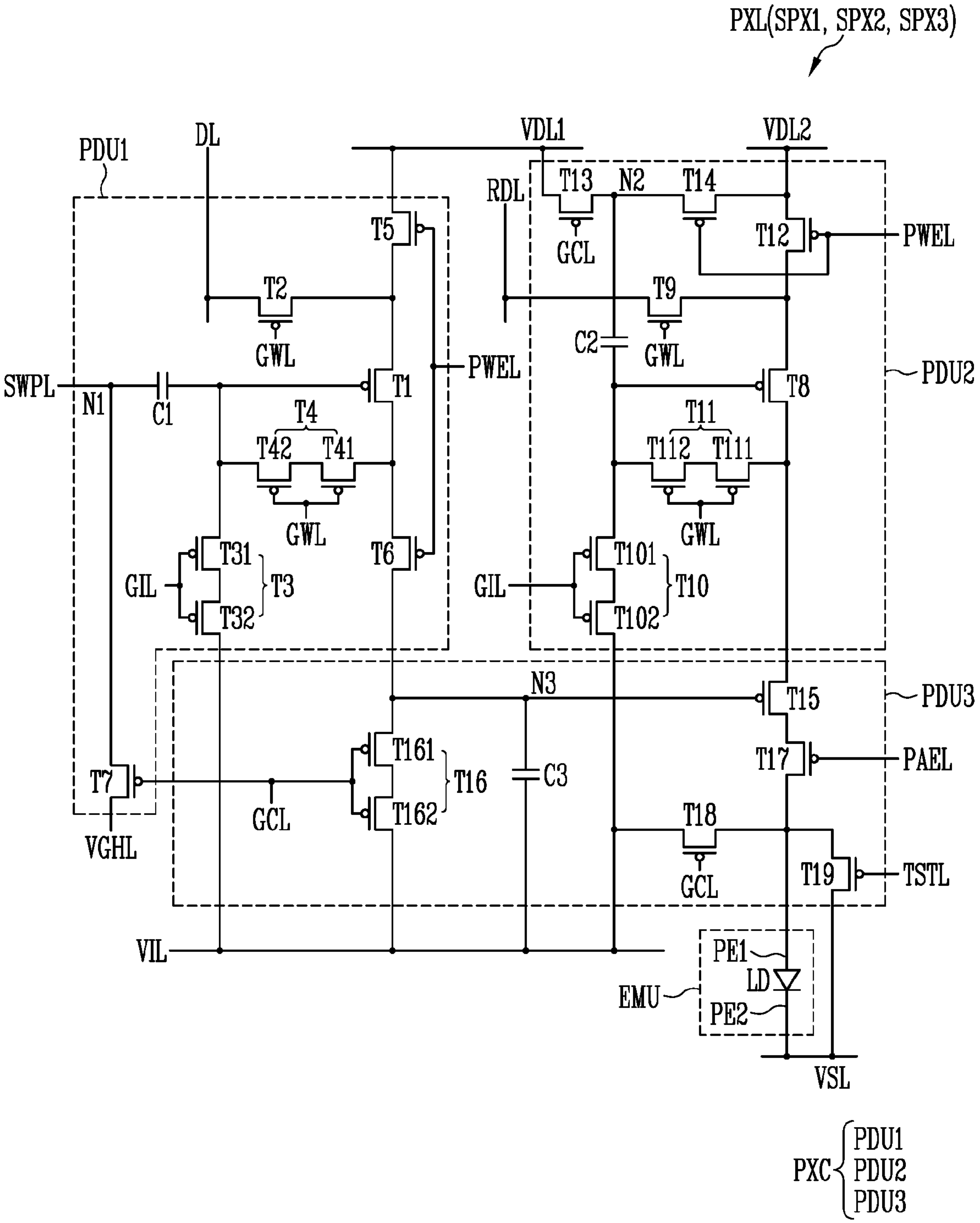
FIG. 9 illustrates a schematic circuit diagram of an electrical connection relationship of constituent elements included in a pixel according to an embodiment.

FIG. 9 illustrates a schematic circuit diagram of an electrical connection relationship of constituent elements that may be included in the pixel PXL according to an embodiment.

For example, FIG. 9 illustrates an electrical connection relationship of constituent elements that may be included in each of the first to third sub-pixels SPX1, SPX2, and SPX3 that may be applied to an active matrix type of display device according to an embodiment. However, the connection relationship of the constituent elements of each of the first to third sub-pixels SPX1, SPX2, and SPX3 is not limited thereto. In the following embodiment, when the first sub-pixel SPX1, the second sub-pixel SPX2, and the third sub-pixel SPX3 are comprehensively named, they will be referred to as a pixel PXL or pixels PXL.

With respect to an embodiment of FIG. 9, in order to avoid redundant descriptions, differences from an embodiment described above will be described.

Referring to FIG. 1 to FIG. 9, the pixel PXL may include the light emitting portion EMU. In addition, the pixel PXL may selectively further include a pixel circuit PXC for driving the light emitting portion EMU.

In some embodiments, the light emitting portion EMU may include the light emitting element LD connected between a second power line VDL2 to which a second power voltage may be applied and a third power line VSL to which a third power voltage may be applied. In addition, the light emitting portion EMU may include the first electrode PE1 connected to a first end portion (or a second semiconductor layer) of the light emitting element LD and the second electrode PE2 connected to a second end portion (or a first semiconductor layer) of the light emitting element LD. The first electrode PE1 may be an anode, and the second electrode PE2 may be a cathode.

The light emitting element LD may emit light with luminance corresponding to a driving current supplied through the pixel circuit PXC. For example, during each frame period, the pixel circuit PXC may supply a driving current corresponding to a gray value of the corresponding frame to the light emitting portion EMU. The driving current supplied to the light emitting portion EMU may flow to the light emitting element LD. Accordingly, while the light emitting element LD emits light with a luminance corresponding to the driving current, the light emitting portion EMU may emit light.

The pixel circuit PXC may be connected to a scan writing line GWL, a scan initializing line GIL, a scan controlling line GCL, a sweep line SWPL, a PWM light emitting line PWEL, a PAM light emitting line PAEL, and a data line DL, a PAM data line RDL, and a test signal line TSTL. The pixel circuit PXC may be connected to a first power line VDL1 to which a first power voltage may be applied, a second power line VDL2 to which a second power voltage may be applied, and a third power line VSL to which a third power voltage may be applied, an initializing voltage line VIL to which an initializing voltage may be applied, and a gate-off voltage line VGHL to which a gate-off voltage VGH may be applied.

The pixel circuit PXC may include a first pixel driver PDU1, a second pixel driver PDU2, and a third pixel driver PDU3. The pixel circuit PXC may be electrically connected to the light emitting element LD of the pixel PXL (or each of the first to third sub-pixels SPX1, SPX2, and SPX3).

The light emitting element LD may emit light according to a driving current generated by the second pixel driver PDU2. The light emitting element LD may be disposed between a seventeenth transistor T17 and the third power line VSL. The first end portion (or the first electrode PE1) of the light emitting element LD may be connected to a second terminal of the seventeenth transistor T17, and the second end portion (or the second electrode PE2) of the light emitting element LD may be connected to the third power line VSL. The light emitting element LD may be an inorganic light emitting element including an inorganic semiconductor disposed between the first electrode PE1 and the second electrode PE2. For example, the light emitting element LD may be a micro LED made of an inorganic semiconductor, but is not limited thereto.

The first pixel driver PDU1 may generate a control current based on a data voltage of the data line DL to control a voltage of a third node N3 of the third pixel driver PDU3. The control current of the first pixel driver PDU1 may adjust a pulse width of a voltage applied to the first end portion (or the first electrode PE1) of the light emitting element LD. The first pixel driver PDU1 may perform pulse width modulation of a voltage applied to the first end portion (or the first electrode PE1) of the light emitting element LD. Accordingly, the first pixel driver PDU1 may be a PWM portion.

The first pixel driver PDU1 may include first to seventh transistors T1 to T7 and a first capacitor C1.

The first transistor T1 may control a control current flowing between a second terminal thereof and a first terminal thereof based on a data voltage applied to a gate electrode thereof.

The second transistor T2 may be turned on by a scan writing signal of the scan writing line GWL to supply the data voltage of the data line DL to the first terminal of the first transistor T1. A gate electrode of the second transistor T2 may be connected to the scan writing line GWL, a first terminal thereof may be connected to the data line DL, and the second terminal thereof may be connected to the first terminal of the first transistor T1.

The third transistor T3 may be turned on by the scan initializing signal of the scan initializing line GIL to electrically connect the initializing voltage line VIL to the gate electrode of the first transistor T1. During a period in which the third transistor T3 may be turned on, the gate electrode of the first transistor T1 may be discharged to the initializing voltage of the initializing voltage line VIL. A gate-on voltage VGL of the scan initializing signal may be different from the initializing voltage of the initializing voltage line VIL. Since a difference voltage between the gate-on voltage VGL and the initializing voltage may be larger than a threshold voltage of the third transistor T3, even after the initializing voltage may be applied to the gate electrode of the first transistor T1, the third transistor T3 may be stably turned on. Accordingly, in case that the third transistor T3 is turned on, the gate electrode of the first transistor T1 may stably receive the initializing voltage regardless of the threshold voltage of the third transistor T3.

The third transistor T3 may include multiple transistors connected in series. For example, the third transistor T3 may include a first sub-transistor T31 and a second sub-transistor T32. The first and second sub-transistors T31 and T32 may prevent the voltage of the gate electrode of the first transistor T1 from leaking through the third transistor T3. A gate electrode of the first sub-transistor T31 may be connected to the scan initializing line GIL, a first terminal thereof may be connected to the gate electrode of the first transistor T1, and a second terminal thereof may be connected to the first terminal of the second sub-transistor T32. A gate electrode of the second sub-transistor T32 may be connected to the scan initializing line GIL, a first terminal thereof may be connected to the second terminal of the first sub-transistor T31, and a second terminal thereof may be connected to the initializing voltage line VIL.

The fourth transistor T4 may be turned on by the scan writing signal of the scan write line GWL to electrically connect the gate electrode of the first transistor T1 and the second terminal thereof. Accordingly, during a period in which the fourth transistor T4 may be turned on, the first transistor T1 may operate as a diode.

The fourth transistor T4 may include multiple transistors connected in series. For example, the fourth transistor T4 may include a third sub-transistor T41 and a fourth sub-transistor T42. The third and fourth sub-transistors T41 and T42 may prevent the voltage of the gate electrode of the first transistor T1 from leaking through the fourth transistor T4. A gate electrode of the third sub-transistor T41 may be connected to the scan writing line GWL, a first terminal thereof may be connected to the second terminal of the first transistor T1, and a second terminal thereof may be connected to a first terminal of the fourth sub-transistor T42. A gate electrode of the fourth sub-transistor T42 may be connected to the scan writing line GWL, a first terminal thereof may be connected to the second terminal of the third sub-transistor T41, and a second terminal thereof may be connected to the gate electrode of the first transistor T1.

The fifth transistor T5 may be turned on by the PWM light emitting signal of the PWM light emitting line PWEL to electrically connect the first power line VDL1 to the first terminal of the first transistor T1. A gate electrode of the fifth transistor T5 may be connected to the PWM light emitting line PWEL, a first terminal thereof may be connected to the first power line VDL1, and a second terminal thereof may be connected to the first terminal of the first transistor T1.

The sixth transistor T6 may be turned on by the PWM light emitting signal of the PWM light emitting line PWEL to electrically connect the second terminal of the first transistor T1 to the third node N3 of the third pixel driver PDU3. A gate electrode of the sixth transistor T6 may be connected to the PWM light emitting line PWEL, a first terminal thereof may be connected to the second terminal of the first transistor T1, and a second terminal thereof may be connected to the third node N3 of the third pixel driver PDU3.

The seventh transistor T7 may be turned on by the scan controlling signal of the scan controlling line GCL to supply the gate-off voltage VGH of the gate-off voltage line VGHL to a first node N1 connected to the sweep line SWPL. Accordingly, during the period in which the initializing voltage may be applied to the gate electrode of the first transistor T1 and the period in which the data voltage of the data line DL and the threshold voltage Vth1 of the first transistor T1 may be programmed, it may be possible to prevent the voltage change of the gate electrode of the first transistor T1 from being reflected in the sweep signal of the sweep line SWPL by the first capacitor C1. A gate electrode of the seventh transistor T7 may be connected to the scan controlling line GCL, a first terminal thereof may be connected to the gate-off voltage line VGHL, and a second terminal thereof may be connected to the first node N1.

The first capacitor C1 may be disposed between the gate electrode of the first transistor T1 and the first node N1. An electrode (or a first capacitor electrode) of the first capacitor C1 may be connected to the gate electrode of the first transistor T1, and another electrode (or a second capacitor electrode) thereof may be connected to the first node N1.

The first node N1 may be a contact point between the sweep line SWPL, the second terminal of the seventh transistor T7, and another electrode of the first capacitor C1.

The second pixel driver PDU2 may generate a driving current supplied to the light emitting element LD based on the PAM data voltage of the PAM data line RDL. The second pixel driver PDU2 may be a pulse amplitude modulation (PAM) portion that performs pulse amplitude modulation. The second pixel driver PDU2 may be a constant current generator that receives the same PAM data voltage to generate the same driving current regardless of the luminance of the first to third sub-pixels SPX1, SPX2, and SPX3.

The second pixel driver PDU2 may include eighth to fourteenth transistors T8 to T14 and a second capacitor C2.

The eighth transistor T8 may control a driving current flowing into the light emitting element LD based on a voltage applied to a gate electrode thereof.

The ninth transistor T9 may be turned on by the scan writing signal of the scan writing line GWL to supply the PAM data voltage of the PAM data line RDL to a first terminal of the eighth transistor T8. The gate electrode of the eighth transistor T8 may be connected to the scan writing line GWL, the first terminal thereof may be connected to the PAM data line RDL, and a second terminal thereof may be connected to the first terminal of the eighth transistor T8.

The tenth transistor T10 may be turned on by the scan initializing signal of the scan initializing line GIL to electrically connect the initializing voltage line VIL to the gate electrode of the eighth transistor T8. During a period in which the tenth transistor T10 may be turned on, the gate electrode of the eighth transistor T8 may be discharged to the initializing voltage of the initializing voltage line VIL. The gate-on voltage VGL of the scan initializing signal may be different from the initializing voltage of the initializing voltage line VIL. Since a difference voltage between the gate-on voltage VGL and the initializing voltage may be larger than a threshold voltage of the tenth transistor T10, even after the initializing voltage may be applied to the gate electrode of the eighth transistor T8, the tenth transistor T10 may be stably turned on. Accordingly, in case that the tenth transistor T10 is turned on, the gate electrode of the eighth transistor T8 may stably receive the initializing voltage regardless of the threshold voltage of the tenth transistor T10.

The tenth transistor T10 may include multiple transistors connected in series. For example, the tenth transistor T10 may include a fifth sub-transistor T101 and a sixth sub-transistor T102. The fifth and sixth sub-transistors T101 and T102 may prevent the voltage of the gate electrode of the eighth transistor T8 from leaking through the tenth transistor T10. A gate electrode of the fifth sub-transistor T101 may be connected to the scan initializing line GIL, a first terminal thereof may be connected to the gate electrode of the eighth transistor T8, and a second terminal thereof may be connected to a first terminal of the sixth sub-transistor T102. A gate electrode of the sixth sub-transistor T102 may be connected to the scan initializing line GIL, a first terminal thereof may be connected to the second terminal of the fifth sub-transistor T101, and a second terminal thereof may be connected to the initializing voltage line VIL.

The eleventh transistor T11 may be turned on by the scan writing signal of the scan writing line GWL to electrically connect the gate electrode of the eighth transistor T8 and a second terminal thereof. Accordingly, during a period in which the eleventh transistor T11 may be turned on, the eighth transistor T8 may operate as a diode The eleventh transistor T11 may include multiple transistors connected in series. For example, the eleventh transistor T11 may include a seventh sub-transistor T111 and an eighth sub-transistor T112. The seventh and eighth sub-transistors T111 and T112 may prevent the voltage of the gate electrode of the eighth transistor T8 from leaking through the eleventh transistor T11. A gate electrode of the seventh sub-transistor T111 may be connected to the scan writing line GWL, a first terminal thereof may be connected to the second terminal of the eighth transistor T8, and a second terminal thereof may be connected to a first terminal of the eighth sub-transistor T112. A gate electrode of the eighth sub-transistor T112 may be connected to the scan writing line GWL, the first terminal thereof may be connected to the second terminal of the seventh sub-transistor T111, and a second terminal thereof may be connected to the gate electrode of the eighth transistor T8.

The twelfth transistor T12 may be turned on by the PWM light emitting signal of the PWM light emitting line PWEL to electrically connect the first terminal of the eighth transistor T8 to the second power line VDL2. A gate electrode of the twelfth transistor T12 may be connected to the PWM light emitting line PWEL, a first terminal thereof may be connected to the first power line VDL1, and a second terminal thereof may be connected to the first terminal of the eighth transistor T8.

The thirteenth transistor T13 may be turned on by the scan controlling signal of the scan controlling line GCL to electrically connect the first power line VDL1 to a second node N2. A gate electrode of the thirteenth transistor T13 may be connected to the scan controlling line GCL, a first terminal thereof may be connected to the first power line VDL1, and a second terminal thereof may be connected to the second node N2.

The fourteenth transistor T14 may be turned on by the PWM light emitting signal of the PWM light emitting line PWEL to electrically connect the first terminal of the eighth transistor T8 to the second node N2. A gate electrode of the fourteenth transistor T14 may be connected to the PWM light emitting line PWEL, a first terminal thereof may be connected to the second power line VDL2, and a second terminal thereof may be connected to the second node N2.

The second capacitor C2 may be disposed between the gate electrode of the eighth transistor T8 and the second node N2. An electrode (or a first capacitor electrode) of the second capacitor C2 may be connected to the gate electrode of the eighth transistor T8, and another electrode (or a second capacitor electrode) may be connected to the second node N2.

The second node N2 may be a contact point between the second terminal of the thirteenth transistor T13, the second terminal of the fourteenth transistor T14, and another electrode of the second capacitor C2.

The third pixel driver PDU3 may control the period during which the driving current may be supplied to the light emitting element LD based on the voltage of the third node N3.

The third pixel driver PDU3 may include fifteenth to nineteenth transistors T15 to T19 and a third capacitor C3.

The fifteenth transistor T15 may be turned on based on the voltage of the third node N3. In case that the fifteenth transistor T15 is turned on, the driving current of the eighth transistor T8 may be supplied to the light emitting element LD. In case that the fifteenth transistor T15 is turned off, the driving current of the eighth transistor T8 may not be supplied to the light emitting element LD. Accordingly, the turn-on period of the fifteenth transistor T15 may be substantially the same as the light emitting period of the light emitting element LD. A gate electrode of the fifteenth transistor T15 may be connected to the third node N3, a first terminal thereof may be connected to the second terminal of the eighth transistor T8, and a second terminal thereof may be connected to a first terminal of the seventeenth transistor T17.

The sixteenth transistor T16 may be turned on by the scan controlling signal of the scan controlling line GCL to electrically connect the initializing voltage line VIL to the third node N3. Accordingly, during the period in which the sixteenth transistor T16 may be turned on, the third node N3 may be discharged to the initializing voltage of the initializing voltage line VIL.

The sixteenth transistor T16 may include multiple transistors connected in series. For example, the sixteenth transistor T16 may include a ninth sub-transistor T161 and a tenth sub-transistor T162. The ninth and tenth sub-transistor T161 and T162 may prevent the voltage of the third node N3 from leaking through the sixteenth transistor T16. A gate electrode of the ninth sub-transistor T161 may be connected to the scan controlling line GCL, a first terminal thereof may be connected to the third node N3, and a second terminal thereof may be connected to a first terminal of the tenth sub-transistor T162. A gate electrode of the tenth sub-transistor T162 may be connected to the scan controlling line GCL, the first terminal thereof may be connected to the second terminal of the ninth sub-transistor T161, and a second terminal thereof may be connected to the initializing voltage line VIL.

The seventeenth transistor T17 may be turned on by the PAM light emitting signal of the PAM light emitting line PAEL to electrically connect the second terminal of the fifteenth transistor T15 to the first electrode PE1 (or the first end portion of the light emitting element LD). A gate electrode of the seventeenth transistor T17 may be connected to the PAM light emitting line PAEL, a first terminal thereof may be connected to the second terminal of the fifteenth transistor T15, and a second terminal thereof may be connected to the first electrode PE1 (or the first end portion of the light emitting element LD).

The eighteenth transistor T18 may be turned on by the scan controlling signal of the scan controlling line GCL to electrically connect the initializing voltage line VIL to the first electrode PE1 (or the first end portion of the light emitting element LD). Accordingly, during the period in which the eighteenth transistor T18 may be turned on, the first end portion of the light emitting element LD may be discharged to the initializing voltage of the initializing voltage line VIL. A gate electrode of the eighteenth transistor T18 may be connected to the scan controlling line GCL, a first terminal thereof may be connected to the first electrode PE1 (or the first end portion of the light emitting element LD), and a second terminal thereof may be connected to the initializing voltage line VIL.

The nineteenth transistor T19 may be turned on by the test signal of the test signal line TSTL to electrically connect the first electrode PE1 (or the first end portion of the light emitting element LD) to the third power line VSL. A gate electrode of the nineteenth transistor T19 may be connected to the test signal line TSTL, a first terminal thereof may be connected to the first electrode PE1 (or the first end portion of the light emitting element LD), and a second terminal thereof may be connected to the third power line VSL.

The third capacitor C3 may be disposed between the third node N3 and the initializing voltage line VIL. An electrode (or a first capacitor electrode) of the third capacitor C3 may be connected to the third node N3, and another electrode (or a second capacitor electrode) thereof may be connected to the initializing voltage line VIL.

The third node N3 may be a contact point between the second terminal of the sixth transistor T6, the gate electrode of the fifteenth transistor T15, the first terminal of the ninth sub-transistor T161, and an electrode of the third capacitor C3.

One of the first and second terminals of each of the first to nineteenth transistors T1 to T19 may be a source electrode, and another thereof may be a drain electrode. The semiconductor layer of each of the first to nineteenth transistors T1 to T19 may be formed of at least one of poly silicon, amorphous silicon, and an oxide semiconductor. In case that the semiconductor layer of each of the first to nineteenth transistors T1 to T19 is poly silicon, it may be formed by a low temperature poly silicon (LTPS) process.

In the above embodiment, each of the first to nineteenth transistors T1 to T19 that may be formed of a P-type of MOSFET has been described, but embodiments are not limited thereto. In some embodiments, each of the first to nineteenth transistors T1 to T19 may be formed of an N-type of MOSFET. In addition, in the above embodiment, it has been described that the pixel circuit PXC includes the first to nineteenth transistors T1 to T19, but the number of the transistors is not limited thereto. In addition, the connection relationship of the first to nineteenth transistors T1 to T19 is not limited to an embodiment of FIG. 9.

FIG. 10 to FIG. 13 illustrate schematic cross-sectional views taken along line II-II' of FIG. 4.

Figure 10:
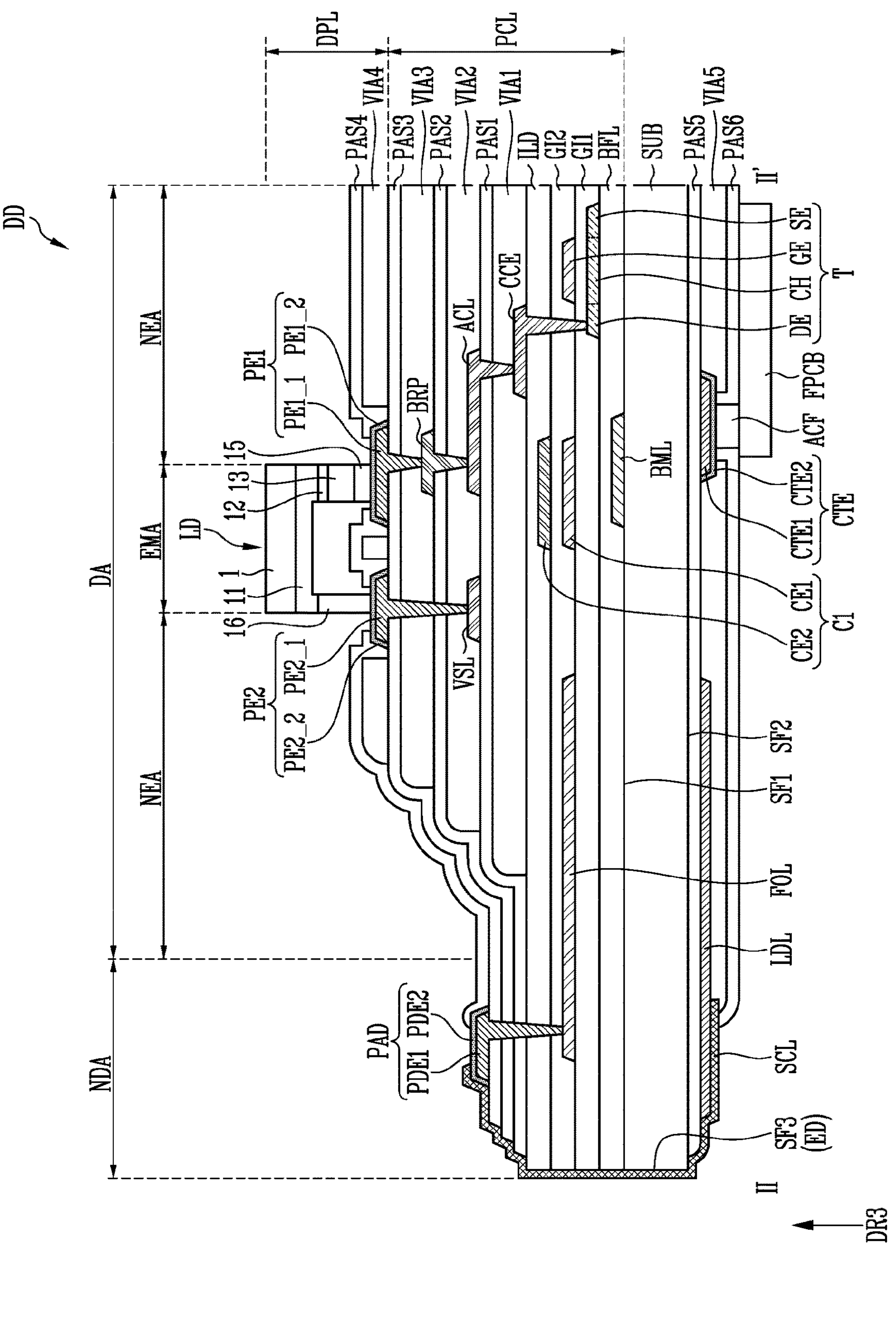
FIG. 10 to FIG. 13 illustrate schematic cross-sectional views taken along line II-II' of FIG. 4.
Figure 11:
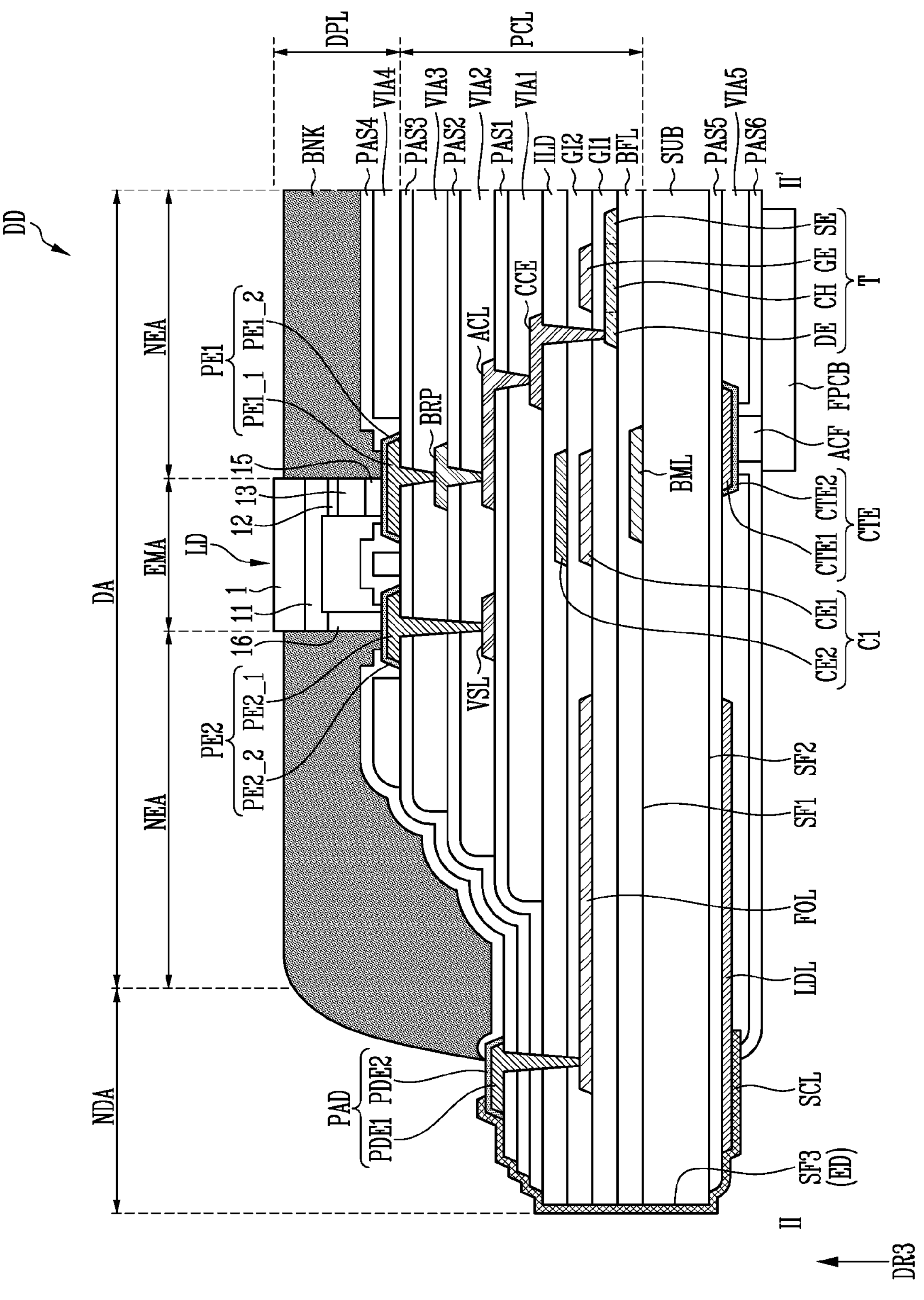
Figure 12:
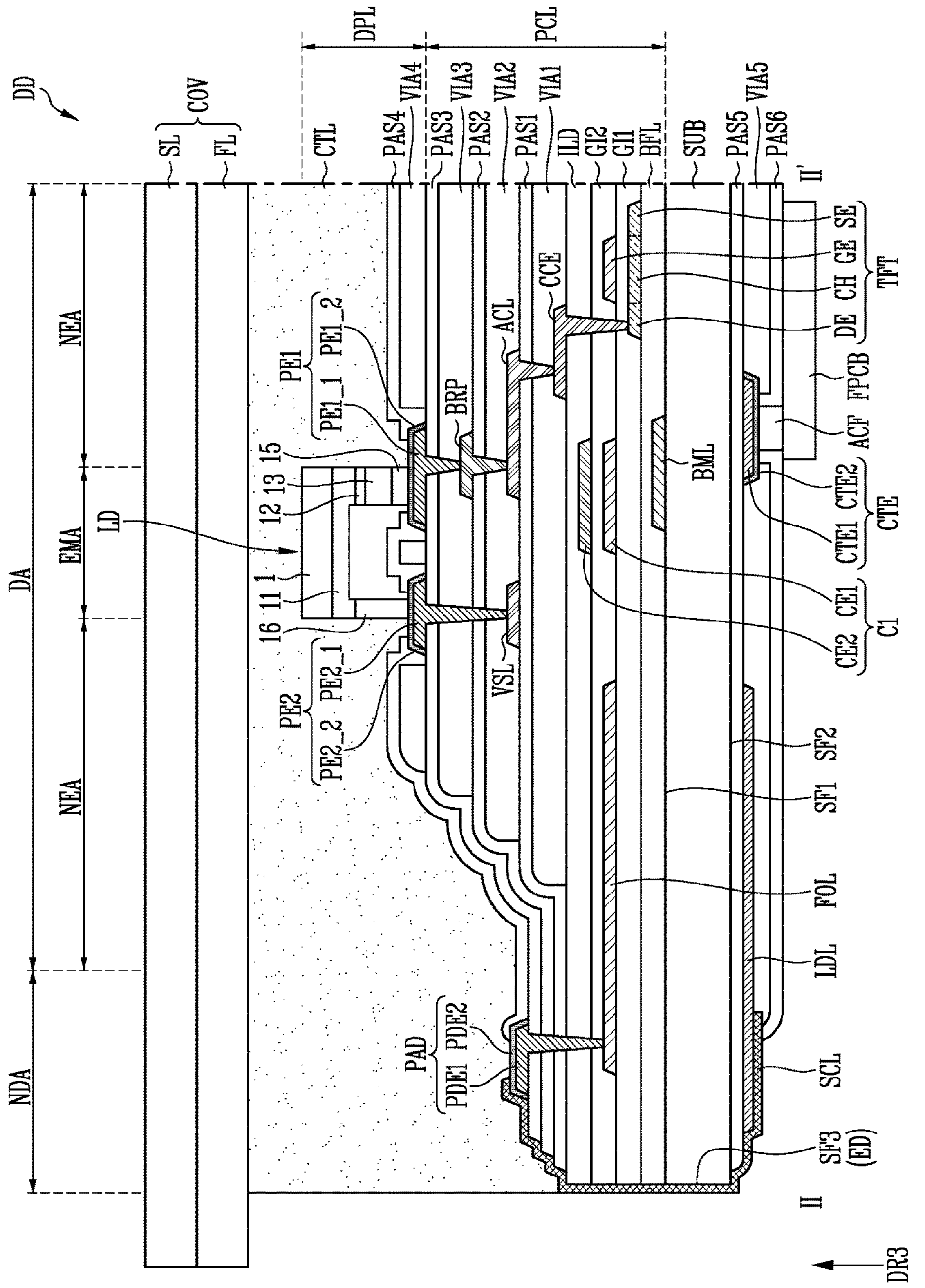

The embodiments of FIG. 11 and FIG. 12 illustrate variations of an embodiment of FIG. 10 with respect to the presence or absence of components positioned on or adjacent to the light emitting element LD. For example, FIG. 11 illustrates an embodiment including a bank BNK provided adjacent to the light emitting element LD, and FIG. 12 illustrates an embodiment in which a cover layer COV may be disposed at an upper portion of the light emitting element LD.

Figure 13:
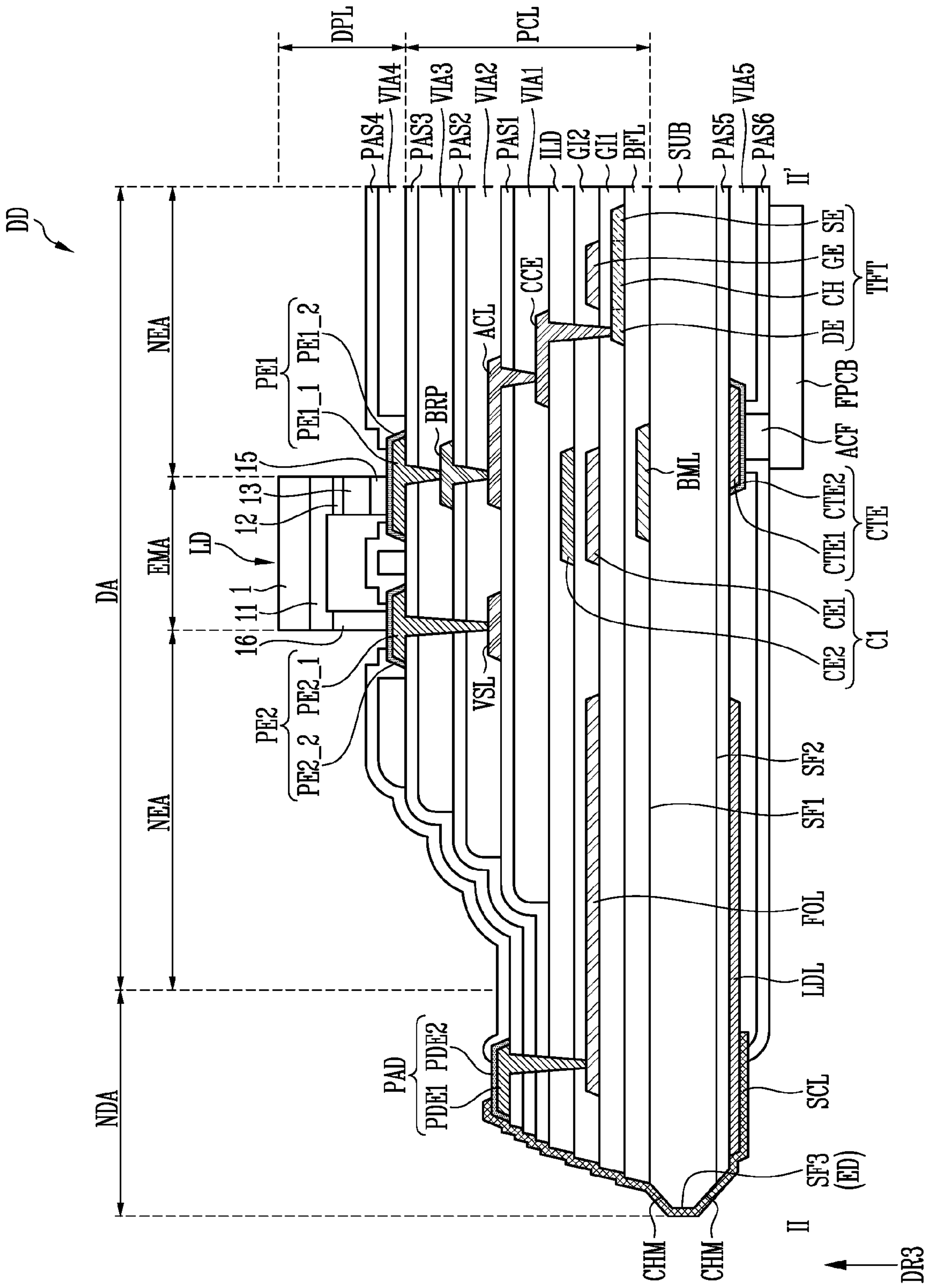

FIG. 13 illustrates an embodiment in which a chamfered portion CHM may be disposed at an edge ED of the display device DD (or the substrate SUB).

FIG. 10 to FIG. 13 illustrate a simplified display device DD by illustrating each electrode only as a single-layered electrode and each insulating layer only as a single-layered insulating layer, but the disclosure is not limited thereto.

In relation to embodiments of FIG. 10 to FIG. 13, differences from the above-described embodiments will be described in order to avoid duplicate descriptions.

Referring to FIG. 1 to FIG. 13, the display device DD may include the display area DA and the non-display area NDA. The display area DA may include a light emitting area EMA from which light may be emitted, and a non-light emitting area NEA that may be adjacent to the light emitting area EMA and from which light may not be emitted. A pad portion PAD may be disposed in the non-display area NDA.

The display device DD may include the substrate SUB, the pixel circuit layer PCL, and the display element layer DPL. In addition, the display device DD may include a flexible film FPCB positioned on a second side SF2 (or rear side) of the substrate SUB.

The substrate SUB may support the display device DD. The substrate SUB may be a base substrate or a base member. The substrate SUB may be a flexible substrate that may be bendable, foldable, or rollable. For example, the substrate SUB may include an insulating material such as a polymer resin such as polyimide (PI), but is not limited thereto. In some embodiments, the substrate SUB may be a rigid substrate including a glass material.

The substrate SUB may include a first surface SF1 and the second surface SF2 facing each other in the third direction DR3. The first surface SF1 may be a mounting surface on which the light emitting element LD may be mounted, and the second surface SF2 may be a surface on which the flexible film FPCB may be disposed. The first surface SF1 may be an upper surface of the substrate SUB, and the second surface SF2 may be a lower surface of the substrate SUB. In addition, the substrate SUB may include a side surface SF3 (or one side surface) that may be positioned between the first surface SF1 and the second surface SF2 and may be continuous to the first surface SF1 and the second surface SF2. The side surface SF3 may be the edge ED of the display device DD.

In some embodiments, the substrate SUB may include the chamfered portion CHM (or chamfered surface) formed between the first surface SF1 and the side surface SF3 and between the second surface SF2 and the side surface SF3 as shown in FIG. 13. Due to the chamfered portion CHM, the side surface SF3 of the substrate SUB may have a predetermined inclination. Accordingly, it may be possible to prevent disconnection of a side connecting wire SCL surrounding the first surface SF1, the second surface SF2, and the side surface SF3 of the substrate SUB at the edge ED of the display device DD. In addition, when multiple display devices DD implement the tiled display device TDD, the chamfered portion CHM may prevent the substrates SUB of each of the display devices DD from being collided and damaged.

The pixel circuit layer PCL and the display element layer DPL may be disposed to overlap each other on the first surface SF1 (or the upper surface) of the substrate SUB. For example, the display device DD may include the pixel circuit layer PCL disposed on the first surface SF1 of the substrate SUB, and the display element layer DPL disposed on the pixel circuit layer PCL.

In some embodiments, the pixel circuit layer PCL may include multiple pixel circuits PXC. For example, the pixel circuit layer PCL may include a first pixel circuit PXC1 of the first sub-pixel SPX1, a second pixel circuit PXC2 of the second sub-pixel SPX2, and a third pixel circuit PXC3 of the third sub-pixel SPX3. In addition, the pixel circuit layer PCL may include signal wires electrically connected to each of the first, second, and third pixel circuits PXC1, PXC2, and PXC3.

The pixel circuit layer PCL may include at least one insulating layer disposed on the first surface SF1 of the substrate SUB. For example, the insulating layer may include a buffer layer BFL, a first gate insulating layer GI1, a second gate insulating layer GI2, an interlayer insulating layer ILD, a first via layer VIA1, a first passivation layer PAS1, a second via layer VIA2, a second passivation layer PAS2, a third via layer VIA3, and a third passivation layer PAS3 that may be sequentially stacked on each other on the first surface SF1 of the substrate SUB in the third direction DR3 (or the thickness direction of the substrate SUB).

The buffer layer BFL may be entirely disposed on the first surface SF1 of the substrate SUB. The buffer layer BFL may prevent impurities from spreading into the pixel circuits PXC. The buffer layer BFL may be an inorganic insulating film including an inorganic material. The buffer layer BFL may include at least one of a silicon nitride ($SiN_x$), a silicon oxide ($SiO_x$), a silicon oxynitride ($SiO_xN_y$), and an aluminum oxide ($AlO_x$). The buffer layer BFL may be provided as a single layer, but may also be provided as a multilayer of at least double layers or more. In case that the buffer layer BFL is provided as multiple layers, respective layers thereof may be made of the same material or different materials. The buffer layer BFL may be omitted depending on the material, a process condition, and the like of the substrate SUB.

The first gate insulating layer GI1 may be entirely disposed on the buffer layer BFL. The first gate insulating layer GI1 may include the same material as the above-described buffer layer BFL, or may include a material suitable from materials disclosed as constituent materials of the buffer layer BFL. For example, the first gate insulating layer GI1 may be an inorganic insulating film including an inorganic material.

The second gate insulating layer GI2 may be entirely disposed on the first gate insulating layer GI1. The second gate insulating layer GI2 may include the same material as the first gate insulating layer GI1. For example, the second gate insulating layer GI2 may be an inorganic insulating film including an inorganic material.

The interlayer insulating layer ILD may be entirely provided and/or formed on the second gate insulating layer GI2. The interlayer insulating layer ILD may include the same material as the second gate insulating layer GI2, or may include one or more materials selected from the materials disclosed as constituent materials of the gate insulating layer GI.

The first via layer VIA1 may be entirely provided and/or formed on the interlayer insulating layer ILD. The first via layer VIA1 may be an inorganic insulating film including an inorganic material or an organic insulating film including an organic material. The inorganic insulating film may include, for example, at least one of a silicon oxide ($SiO_x$), a silicon nitride ($SiN_x$), a silicon oxynitride ($SiO_xN_y$), an aluminum oxide ($AlO_x$). The organic insulating film may be, for example, at least one of a polyacrylates resin, an epoxy resin, a phenolic resin, a polyamides resin, a polyimides resin, an unsaturated polyesters resin, a poly-phenylen ethers resin, a poly-phenylene sulfides resin, and a benzocyclobutene resin. In an embodiment, the first via layer VIA1 may have a flat surface in order to reduce a step caused by the components disposed thereunder. In an embodiment, the first via layer VIA1 may include an organic insulating film including an organic material.

The first passivation layer PAS1 may be entirely provided and/or formed on the first via layer VIA1. The first passivation layer PAS1 may be an inorganic insulating film including an inorganic material. The first passivation layer PAS1 may include at least one of a silicon nitride ($SiN_x$), a silicon oxide ($SiO_x$), a silicon oxynitride ($SiO_xN_y$), and an aluminum oxide ($AlO_x$).

The second via layer VIA2 may be entirely provided and/or formed on the first passivation layer PAS1. The second via layer VIA2 may include the same material as the first via layer VIA1, or may include a material suitable from the materials disclosed as constituent materials of the first via layer VIA1. For example, the second via layer VIA2 may be an organic insulating film including an organic material.

The second passivation layer PAS2 may be entirely provided and/or formed on the second via layer VIA2. The second passivation layer PAS2 may include the same material as the first passivation layer PAS1. The second passivation layer PAS2 may be an inorganic insulating film including an inorganic material.

The third via layer VIA3 may be entirely provided and/or formed on the second passivation layer PAS2. The third via layer VIA3 may include the same material as the first via layer VIA1. For example, the third via layer VIA3 may be an organic insulating film including an organic material.

The third passivation layer PAS3 may be entirely provided and/or formed on the third via layer VIA3. The third passivation layer PAS3 may include the same material as the first passivation layer PAS1. The third passivation layer PAS3 may be an inorganic insulating film including an inorganic material.

The pixel circuit layer PCL may include at least one conductive layer disposed between the above-described insulating layers. For example, the pixel circuit layer PCL may include a first conductive layer disposed between the substrate SUB and the buffer layer BFL, a second conductive layer disposed between the first gate insulating layer GI1 and the second gate insulating layer GI2, a third conductive layer disposed between the second gate insulating layer GI2 and the interlayer insulating layer ILD, a fourth conductive layer disposed between the interlayer insulating layer ILD and the first via layer VIA1, a fifth conductive layer disposed between the first passivation layer PAS1 and the second via layer VIA2, and a sixth conductive layer disposed between the second passivation layer PAS2 and the third via layer VIA3.

The first conductive layer may be formed to have a single-layered structure of a single or a mixture thereof selected from a group consisting of copper (Cu), molybdenum (Mo), tungsten (W), aluminum neodymium (AlNd), titanium (Ti), aluminum (Al), silver (Ag), and an alloy thereof, or in order to reduce wire resistance, it may be formed to have a double-layered or multi-layered structure of molybdenum (Mo), titanium (Ti), copper (Cu), aluminum (Al) or silver (Ag), which may be a low-resistance material. Each of the second to sixth conductive layers may include the same material as the first conductive layer, or may include one or more materials suitable from materials disclosed as constituent materials of the first conductive layer, but is not limited thereto.

The pixel circuit layer PCL may include the pixel circuit PXC, and electrodes and wires electrically connected to the pixel circuit PXC. For example, the pixel circuit layer PCL may include a bottom metal pattern BML, a transistor T, a first capacitor C1, a fan-out line FOL, a connecting electrode CCE, an anode connecting line ACL, and a bridge pattern BRP, but embodiments are not limited thereto.

The bottom metal pattern BML may block light that may be introduced from the second side SF2 of the substrate SUB to the pixel circuit PXC. The bottom metal pattern BML may be a first conductive layer disposed between the substrate SUB and the buffer layer BFL. In some embodiments, the bottom metal pattern BML may be electrically connected to the transistor T. A driving range of a predetermined voltage supplied to a gate electrode GE of the transistor T may be widened. Although not directly shown in the drawings, the bottom metal pattern BML may be electrically connected to one terminal of the transistor T to stabilize a channel region CH of the transistor T. In addition, as the bottom metal pattern BML may be electrically connected to the transistor T, floating of the bottom metal pattern BML may be prevented.

The transistor T may include a semiconductor pattern and the gate electrode GE overlapping one region of the semiconductor pattern.

The semiconductor pattern may be disposed on the buffer layer BFL. The semiconductor pattern may include a channel region CH, a source electrode SE (or a source region), and a drain electrode DE (or a drain region). The transistor T may be a transistor configuring the pixel circuit PXC. The source electrode SE and the drain electrode DE may be formed into a conductor by heat-treating the semiconductor pattern. For example, the semiconductor pattern may include a polycrystalline silicon, a single crystal silicon, a low temperature polycrystalline silicon, an amorphous silicon, or an oxide semiconductor. As another example, the semiconductor pattern may include first and second active layers that may be disposed on different layers. The first active layer may include a polycrystalline silicon, a single crystal silicon, a low-temperature polycrystalline silicon, or an amorphous silicon, and the second active layer may include an oxide semiconductor.

The gate electrode GE may be disposed on the first gate insulating layer GI1. The gate electrode GE may be the second conductive layer disposed between the first gate insulating layer GI1 and the second gate insulating layer GI2. The gate electrode GE may overlap the channel region CH of the semiconductor pattern. The first gate insulating layer GI1 may insulate the channel region CH and the gate electrode GE of the semiconductor pattern.

The second conductive layer may include the fan-out line FOL and a first capacitor electrode CE1 of the first capacitor C1.

The fan-out line FOL may be positioned on the first gate insulating layer GI1, and may be electrically connected to the pad portion PAD positioned in the non-display area NDA. As an example, the fan-out line FOL may pass through a contact hole of each of the second gate insulating layer GI2, the interlayer insulating layer ILD, the first passivation layer PAS1, the second passivation layer PAS2, and the third passivation layer PAS3 to be electrically connected to the pad portion PAD. The fan-out line FOL may extend from the pad portion PAD to the display area DA, thereby reducing the size of the non-display area NDA.

In some embodiments, the first storage electrode CE1 may be connected to the gate electrode GE of the transistor T.

The second conductive layer including the gate electrode GE, the fan-out line FOL, and the first storage electrode CE1 may be configured as a single layer or a multilayer. The second gate insulating layer GI2 may be disposed on the above-described second conductive layer.

A second capacitor electrode CE2 of the first capacitor C1 may be disposed on the second gate insulating layer GI2. The second capacitor electrode CE2 may be a third conductive layer positioned between the second gate insulating layer GI2 and the interlayer insulating layer ILD. The second capacitor electrode CE2 may overlap the first capacitor electrode CE1 with the second gate insulating layer GI2 interposed therebetween to form capacitance. In case that the overlapping area of the first capacitor electrode CE1 and the second capacitor electrode CE2 is wide, the capacitance of the first capacitor C1 may be increased. The third conductive layer including the second capacitor electrode CE2 can be configured as a single layer or a multilayer.

The interlayer insulating layer ILD may be entirely disposed on the second capacitor electrode CE2.

The connecting electrode CCE may be disposed on the interlayer insulating layer ILD. The connecting electrode CCE may be a fourth conductive layer positioned between the interlayer insulating layer ILD and the first via layer VIA1. The connecting electrode CCE may be connected to the drain electrode DE of the transistor T through a contact hole of each of the interlayer insulating layer ILD, the second gate insulating layer GI2, and the first gate insulating layer GI1. The fourth conductive layer including the connecting electrode CCE may be configured of a single layer or a multilayer.

The first via layer VIA1 may be disposed on the fourth conductive layer. The first via layer VIA1 may planarize an upper end of the fourth conductive layer.

The first passivation layer PAS1 may be disposed on the first via layer VIA1.

The anode connecting line ACL and a third power line VSL may be disposed on the first passivation layer PAS1. The anode connecting line ACL and the third power line VSL may be a fifth conductive layer positioned between the first passivation layer PAS1 and the second via layer VIA2.

The anode connecting line ACL may be electrically connected to the connecting electrode CCE through a contact hole of each of the first passivation layer PAS1 and the first via layer VIA1. The anode connecting line ACL may be electrically connected to the drain electrode DE of the transistor T through the connecting electrode CCE.

The fifth conductive layer including the anode connecting line ACL and the third power line VSL may be configured as a single layer or a multilayer.

The second via layer VIA2 may be disposed on the fifth conductive layer. The second via layer VIA2 may planarize an upper end of the fifth conductive layer.

The second passivation layer PAS2 may be disposed on the second via layer VIA2.

The bridge pattern BRP may be disposed on the second passivation layer PAS2. The bridge pattern BRP may be a sixth conductive layer positioned between the second passivation layer PAS2 and the third via layer VIA3. The bridge pattern BRP may be electrically connected to the anode connecting line ACL through a contact hole of each of the second passivation layer PAS2 and the second via layer VIA2. The bridge pattern BRP may be electrically connected to the transistor T through the anode connecting line ACL and the connecting electrode CCE. The sixth conductive layer including the bridge pattern BRP may be configured as a single layer or a multilayer.

The third via layer VIA3 may be entirely disposed on the sixth conductive layer. The third via layer VIA3 may planarize an upper end of the sixth conductive layer.

The third passivation layer PAS3 may be disposed on the third via layer VIA3. The display element layer DPL may be disposed on the third passivation layer PAS3.

The display element layer DPL may include the first and second electrodes PE1 and PE2 disposed to be spaced apart from each other, and the light emitting element LD electrically connected to the first and second electrodes PE1 and PE2. In addition, the display element layer DPL may include a fourth via layer VIA4 and a fourth passivation layer PAS4.

The first electrode PE1 ("first pixel electrode" or "anode") and the second electrode PE2 ("second pixel electrode" or "cathode") may be positioned in the light emitting area EMA. The first electrode PE1 may be configured of a double layer including a (1-1)-th electrode PE1_1 and a (1-2)-th electrode PE1_2 that may be sequentially stacked on each other, and the second electrode PE2 may be configured of a double layer including a (2-1)-th electrode PE2_1 and a (2-1)-th electrode PE2_2 that may be sequentially stacked on each other. However, the disclosure is not limited thereto, and in some embodiments, the first electrode PE1 and the second electrode PE2 may be configured of a single layer including a material suitable for the materials disclosed as the constituent materials of the first conductive layer.

The (1-1)-th electrode PE1_1 and the (2-1)-th electrode PE2_1 may be a seventh conductive layer disposed on the third passivation layer PAS3. The (1-1)-th electrode PE1_1 and the (2-1)-th electrode PE2_1 may be disposed to be spaced apart from each other on the third passivation layer PAS3. The (1-1)-th electrode PE1_1 and the (2-1)-th electrode PE2_1 may be a single layer or a multilayer that may be made of at least one of molybdenum (Mo), aluminum (Al), chromium (Cr), gold (Au), titanium (Ti), nickel (Ni), neodymium (Nd), and copper (Cu) or an alloy thereof.

The (1-1)-th electrode PE1_1 may be electrically connected to the bridge pattern BRP of the pixel circuit layer PCL through a contact hole of each of the third passivation layer PAS3 and the third via layer VIA3. In some embodiments, in case that the sixth conductive layer including the bridge pattern BRP is omitted, the (1-1)-th electrode PE1_1 may be directly connected to the anode connecting line ACL through a contact hole of each of the third passivation layer PAS3, the third via layer VIA3, the second passivation layer PAS2, and the second via layer VIA2.

The (2-1)-th electrode PE2_1 may pass through a contact hole of each of the third passivation layer PAS3, the third via layer VIA3, the second passivation layer PAS2, and the second via layer VIA2 to be electrically connected to the third power line VSL of the pixel circuit layer PCL. Accordingly, the third power voltage of the third power line VSL may be applied to the (2-1)-th electrode PE2_1.

An eighth conductive layer may be disposed on the (1-1)-th electrode PE1_1 and the (2-1)-th electrode PE2_1. The eighth conductive layer may include a (1-2)-th electrode PE1_2 and a (2-2)-th electrode PE2_2. The (1-2)-th electrode PE1_2 may be disposed on the (1-1)-th electrode PE1_1, and the (2-2)-th electrode PE2_2 may be disposed on the (1-2)-th electrode PE1_2. The eighth conductive layer may include a transparent metallic material (TCO) such as an ITO and an IZO, but is not limited thereto.

The fourth via layer VIA4 may be disposed on the first electrode PE1, the second electrode PE2, and the third passivation layer PAS3.

The fourth via layer VIA4 may include the same material as the first via layer VIA1, or may include a material suitable from the materials disclosed as constituent materials of the first via layer VIA1. The fourth via layer VIA4 may planarize upper ends of the first electrode PE1 and the second electrode PE2. In an embodiment, the fourth via layer VIA4 may be partially opened to expose each of the first electrode PE1 and the second electrode PE2.

The fourth passivation layer PAS4 may be disposed on the fourth via layer VIA4. The fourth passivation layer PAS4 may include the same material as the first passivation layer PAS1, or may include a material suitable from the materials disclosed as the constituent materials of the first passivation layer PAS1. In an embodiment, the fourth passivation layer PAS4 may be partially opened to expose each of the first electrode PE1 and the second electrode PE2. The light emitting element LD may be transferred onto the upper portions of the exposed first and second electrodes PE1 and PE2 so that the first and second electrodes PE1 and PE2 contact the light emitting element LD to be electrically connected thereto.

The light emitting element LD may include a first contact electrode 15, a second contact electrode 16, a first semiconductor layer 11, an active layer 12, and a second semiconductor layer 13. FIG. 10 to FIG. 13 illustrate the light emitting element LD as a flip-chip type of micro light emitting diode in which the first contact electrode 15 thereof may be in contact with the first electrode PE1 and the second contact electrode 16 thereof may be in contact with the second electrode PE2.

In the light emitting element LD, a length in a vertical direction, a length in a horizontal direction, and a length in a thickness direction (or the third direction DR3) of the substrate may be several to several hundred μm, respectively.

The light emitting element LD may be grown on a semiconductor substrate such as a silicon wafer and then be formed. The light emitting element LD may be directly transferred from the silicon wafer onto the first electrode PE1 and the second electrode PE2 of the substrate SUB. In addition, the light emitting element LD may be transferred onto the first electrode PE1 and the second electrode PE2 of the substrate SUB through an electrostatic method using an electrostatic head or a stamping method that uses an elastic polymer material such as PDMS or silicon as a transfer substrate.

The light emitting element LD may be a light emitting structure including a base substrate 1, the first semiconductor layer 11, the active layer 12, the second semiconductor layer 13, the first contact electrode 15, and the second contact electrode 16. The light emitting element LD may include a first end portion contacting the first electrode PE1 and a second end portion contacting the second electrode PE2. The second semiconductor layer 13 (or the first contact electrode 15) may be positioned at the first end portion, and the first semiconductor layer 11 (or the second contact electrode 16) may be positioned at the second end portion.

The base substrate 1 may be a sapphire substrate, but is not limited thereto.

The first semiconductor layer 11 may be disposed on a surface of the base substrate 1. For example, the first semiconductor layer 11 may be disposed on a lower surface of the base substrate 1. The first semiconductor layer 11 may be made of GaN doped with an N-type conductive dopant such as Si, Ge, Sn, or a combination thereof.

The active layer 12 may be disposed on a portion of a surface of the first semiconductor layer 11. The active layer 12 may include a material having a single- or multi-quantum well structure. When the active layer 12 includes a material having a multi-quantum well structure, well layers and a barrier layer may be alternately stacked on each other. The well layer may be formed of InGaN, and the barrier layer may be formed of GaN or AlGaN, but are not limited thereto. In other embodiments, the active layer 12 may have a structure in which a semiconductor material having large band gap energy and a semiconductor material having small band gap energy may be alternately stacked on each other, or may include group 3 to group 5 semiconductor materials according to a wavelength band of light that emits light.

The second semiconductor layer 13 may be disposed on a surface of the active layer 12. The second semiconductor layer 13 may be made of GaN doped with a P-type conductive dopant such as Mg, Zn, Ca, Se, Ba, or a combination thereof.

The first contact electrode 15 may be disposed on the second semiconductor layer 13, and the second contact electrode 16 may be disposed on another portion of a surface of the first semiconductor layer 11. Another portion of a surface of the first semiconductor layer 11 on which the second contact electrode 16 may be disposed may be disposed apart from a portion of a surface of the first semiconductor layer 11 on which the active layer 12 may be disposed. In some embodiments, the first contact electrode 15 and the second contact electrode 16 may be solder bumps. In addition, according to another embodiment, the first contact electrode 15 and the second contact electrode 16 may be made of a eutectic metal, for example, tin (Sn), indium (In), zinc (Zn), lead (Pb), nickel (Ni), gold (Au), platinum (Pt), copper (Cu), or the like, or a combination thereof, but are not limited thereto.

The first contact electrode 15 and the first electrode PE1 may be bonded to each other through a conductive adhesive member such as an anisotropic conductive film or an anisotropic conductive paste. In other embodiments, the first contact electrode 15 and the first electrode PE1 may be coupled to each other through a soldering process. The second contact electrode 16 and the second electrode PE2 may also be coupled to each other through the above-described method.

In some embodiments, the first electrode PE1 coupled to the first contact electrode 15 of the light emitting element LD and the second electrode PE2 coupled to the second contact electrode 16 of the light emitting element LD may be utilized as bonding electrodes.

The display element layer DPL may include the bank BNK disposed adjacent to the light emitting element LD.

The bank BNK may be a structure defining the light emitting area EMA of the pixel PXL. The bank BNK may be disposed in the non-light emitting area NEA of the pixel PXL. The bank BNK may be configured to include at least one light blocking material and/or reflective material to prevent a light leakage defect in which light leaks between the pixel PXL and pixels adjacent thereto. In some embodiments, a reflective material layer may be separately provided and/or formed on the bank BNK to further improve an efficiency of light emitted from each of the pixels PXL. The bank BNK may include an organic material that stably fixes the light emitting element LD coupled to the first and second electrodes PE1 and PE2 and strengthens adherence between the light emitting element LD and the first and second electrodes PE1 and PE2. In addition, the bank BNK may absorb external light to improve contrast of a screen. In some embodiments, the bank BNK may have a black color. The bank BNK may be positioned in an area in which the light emitting element LD may not be disposed on the first surface SF1 of the substrate SUB. For example, the bank BNK may be positioned between light emitting elements LD.

The pad portion PAD may be disposed on the third passivation layer PAS3 of the pixel circuit layer PCL in the non-display area NDA. The pad portion PAD may supply a voltage or signal received from the side connecting wire SCL to the fan-out line FOL. The pad portion PAD may include a first pad electrode PDE1 and a second pad electrode PDE2. The first pad electrode PDE1 may be formed of the same material as the (1-1)-th and (2-1)-th electrodes PE1_1 and PE2_1 in the same process. The first pad electrode PDE1 may be connected to the fan-out line FOL through a contact hole sequentially passing through the first to third passivation layers PAS1, PAS2, and PAS3, the interlayer insulating layer ILD, and the second gate insulating layer GI2. The second pad electrode PDE2 may be formed of the same material as the (1-2)-th and (2-2)-th electrodes PE1_2 and PE2_2 in the same process. The second pad electrode PDE2 may be electrically connected to a lead line LDL through the side connecting wire SCL.

The display device DD may include a fifth passivation layer PAS5, a fifth via layer VIA5, and a sixth passivation layer PAS6 that may be sequentially stacked on each other on the second surface SF2 of the substrate SUB in an opposite direction of the third direction DR3.

The fifth passivation layer PAS5 may be positioned on the second surface SF2 of the substrate SUB, protect the second surface SF2 of the substrate SUB, and planarize the second surface SF2. The fifth passivation layer PAS5 may be an inorganic insulating film including an inorganic material. The fifth passivation layer PAS5 may include at least one of a silicon nitride ($SiN_x$), a silicon oxide ($SiO_x$), a silicon oxynitride ($SiO_xN_y$), and an aluminum oxide ($AlO_x$).

An intermediate electrode CTE may be disposed on the fifth passivation layer PAS5. The intermediate electrode CTE may supply the voltage or signal received from the flexible film FPCB to the side connecting wire SCL through the lead line LDL. The intermediate electrode CTE may be electrically connected to the flexible film FPCB through a conductive member ACF (or connecting film).

The intermediate electrode CTE may include a first intermediate electrode CTE1 and a second intermediate electrode CTE2. The first intermediate electrode CTE1 may be disposed on a surface of or a lower surface of the fifth passivation layer PAS5. The first intermediate electrode CTE1 may be a single layer or a multilayer that may be made of at least one of molybdenum (Mo), aluminum (Al), chromium (Cr), gold (Au), titanium (Ti), nickel (Ni), neodymium (Nd), and copper (Cu) or an alloy thereof. The second intermediate electrode CTE2 may be disposed on a surface of or a lower surface of the first intermediate electrode CTE1. The second intermediate electrode CTE2 may include a transparent conductive material (TCO) such as an ITO or an IZO.

The lead line LDL may be disposed on a surface of or a lower surface of the fifth passivation layer PAS5. The lead line LDL may be formed of the same material on the same layer as the first intermediate electrode CTE1. The lead line LDL may supply a voltage or signal received from the intermediate electrode CTE to the side connecting wire SCL.

The side connecting wire SCL may be disposed on the first surface SF1, the second surface SF2, and the side surface SF3 of the substrate SUB. An end of the side connecting wire SCL may be connected to the lead line LDL, and another end of the side connecting wire SCL may be connected to the pad portion PAD. The side connecting wire SCL may surround the side surfaces of the substrate SUB, the buffer layer BFL, the first and second gate insulating layers GI1 and GI2, the interlayer insulating layer ILD, and the first to third passivation layers PAS1, PAS2, and PAS3.

The fifth via layer VIA5 may be disposed on the fifth passivation layer PAS5, a portion of the intermediate electrode CTE, and a portion of the lead line LDL. The fifth via layer VIA5 may be an organic insulating film including an organic material. The fifth via layer VIA5 may be at least one of a polyacrylates resin, an epoxy resin, a phenolic resin, a polyamides resin, a polyimides resin, an unsaturated polyesters resin, a poly-phenylen ethers resin, a poly-phenylene sulfides resin, and a benzocyclobutene resin. The fifth via layer VIA5 may planarize the second surface SF2 of the substrate SUB.

The sixth passivation layer PAS6 may be disposed on the fifth via layer VIA5, the lead line LDL, and the intermediate electrode CTE to protect the lead line LDL and the intermediate electrode CTE. The sixth passivation layer PAS6 may include the same material as the fifth passivation layer PAS5, or may include a material suitable from the materials disclosed as the constituent materials of the fifth passivation layer PAS5.

The flexible film FPCB may be disposed on a surface of or a lower surface of the sixth passivation layer PAS6. The flexible film FPCB may be attached to the lower surface of the sixth passivation layer PAS6 by using an adhesive member (not shown). A side of the flexible film FPCB may supply a voltage or a signal to the pad portion PAD disposed on the first surface SF1 of the substrate SUB through the intermediate electrode CTE, the lead line LDL, and the side connecting wire SCL. Another side of the flexible film FPCB may be connected to a source circuit board (not shown) at the lower portion of the substrate SUB. The flexible film FPCB may transmit a signal of a display driver (not shown) to the display device DD.

The conductive member ACF may attach the flexible film FPCB to the lower surface of the intermediate electrode CTE. For example, the conductive member ACF may include an anisotropic conductive film. When the conductive member ACF includes an anisotropic conductive film, the conductive member ACF may have conductivity in an area in which the intermediate electrode CTE and the flexible film FPCB contact each other, and may electrically connect the flexible film FPCB to the intermediate electrode CTE.

The display device DD may include the flexible film FPCB disposed on the second surface SF2 of the substrate SUB, the pad portion PAD disposed on the first surface SF1 of the substrate SUB, the intermediate electrode CTE electrically connecting the flexible film FPCB and the pad portion PAD, the lead line LDL, and the side connecting wire SCL, thereby minimizing an area of the non-display area NDA.

In some embodiments, the display device DD may include the cover layer COV that may be disposed on the display element layer DPL. The cover layer COV may be provided on each of multiple display devices DD. The cover layer COV may protrude outside the side surface SF3 of the substrate SUB (or the edge ED of the display device DD).

The cover layer COV may be disposed on the display element layer DPL by using the intermediate layer CTL.

The intermediate layer CTL may be a transparent adhesive layer (or bonding layer) for reinforcing adherence between the display element layer DPL and the cover layer COV, for example, an optically clear adhesive layer, but is not limited thereto. In some embodiments, the intermediate layer CTL may include a filler made of an insulating material having insulating properties and adhesive properties.

The cover layer COV may include a first layer FL and a second layer SL sequentially disposed on the intermediate layer CTL.

The first layer FL may be a light transmittance controlling layer designed to reduce transmittance of external light or light reflected on the display device DD. Due to the first layer FL, it may be possible to prevent a gap between adjacent display devices DD from being viewed from the outside. The first layer FL may include a phase delaying layer, but is not limited thereto.

The second layer SL may be an anti-glare layer designed to diffusely reflect external light in order to prevent deterioration of image visibility by reflecting external light as it is. Due to the second layer SL, a contrast ratio of an image displayed by the display device DD may be increased. The second layer SL may include a polarizing plate, but is not limited thereto.

Figure 14:
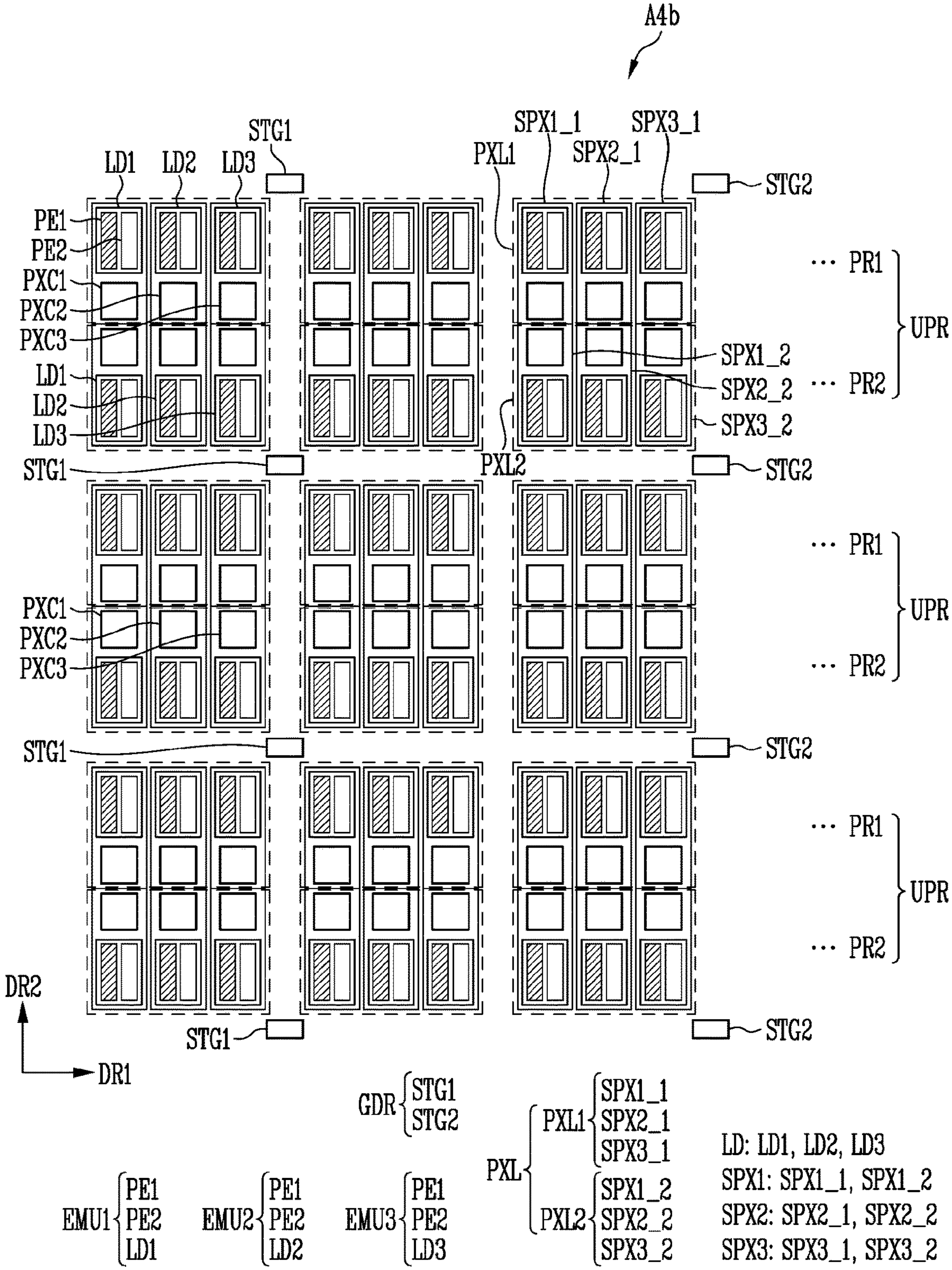
FIG. 14 schematically illustrates a disposition relationship between a pixel and a gate driver in a second sub-area of a display device according to an embodiment.
Figure 15:
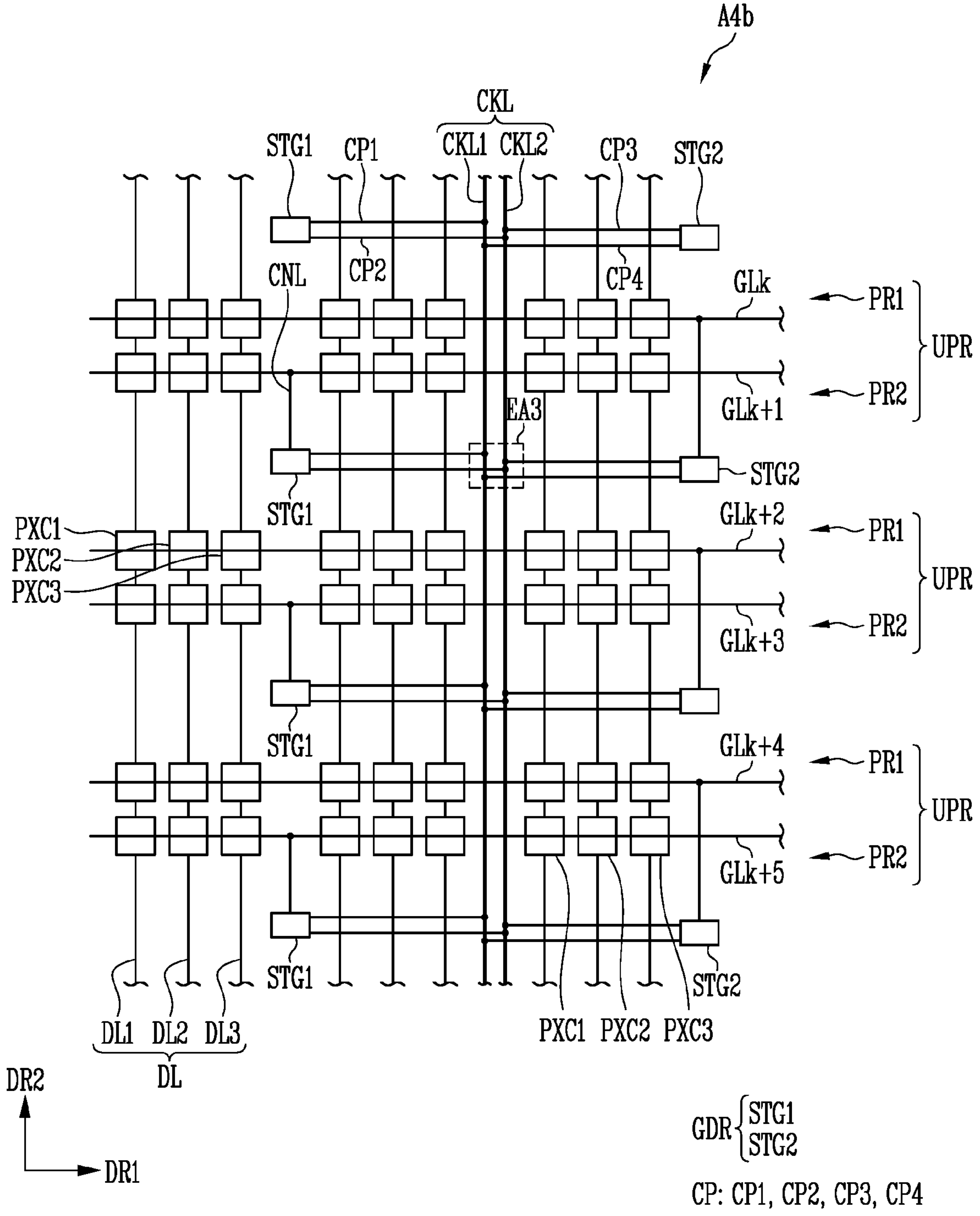
FIG. 15 and FIG. 16 schematically illustrate electrical connection relationships between a pixel circuit and a gate driver in a second sub-area of a display device according to an embodiment.
Figure 16:
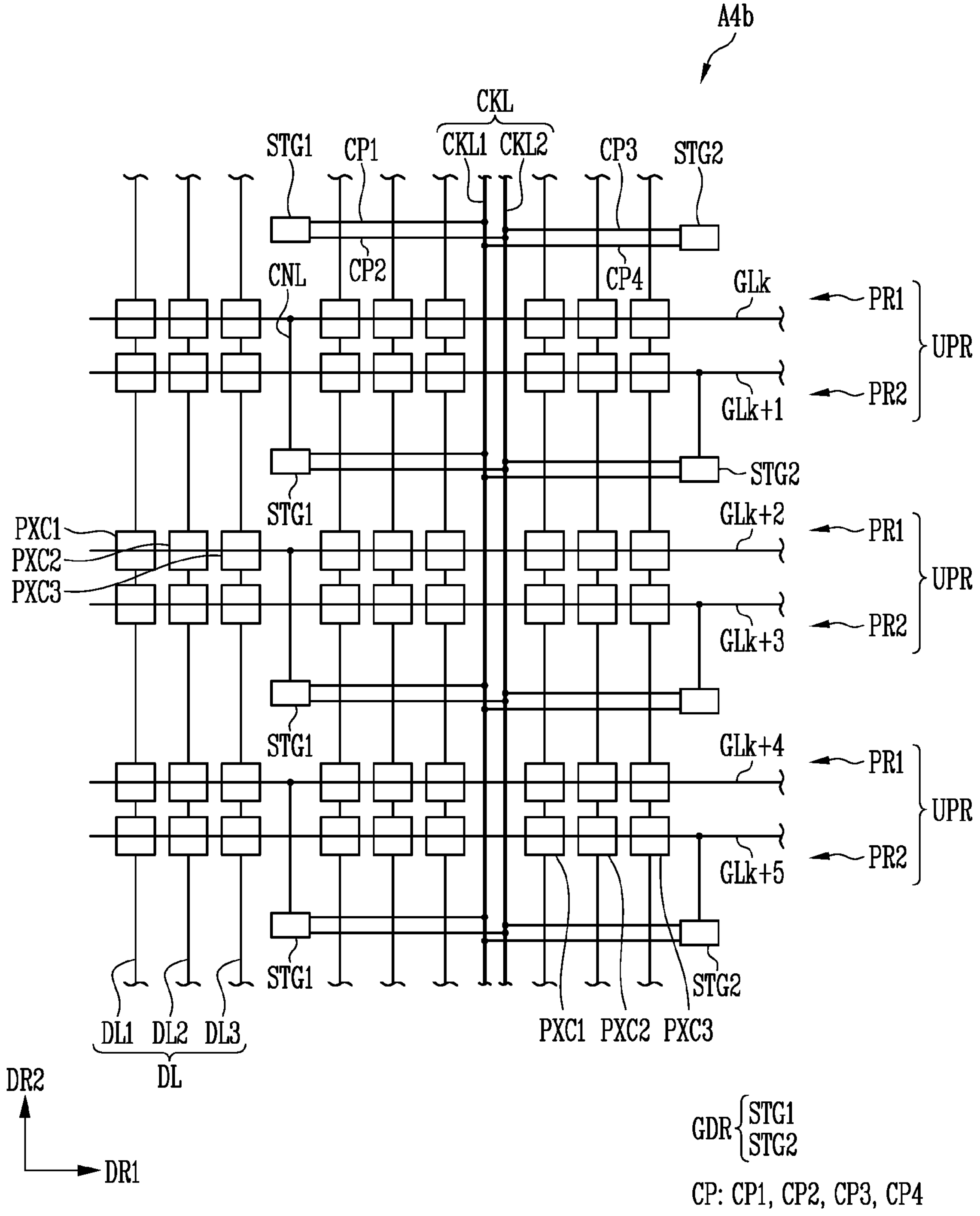
Figure 17:
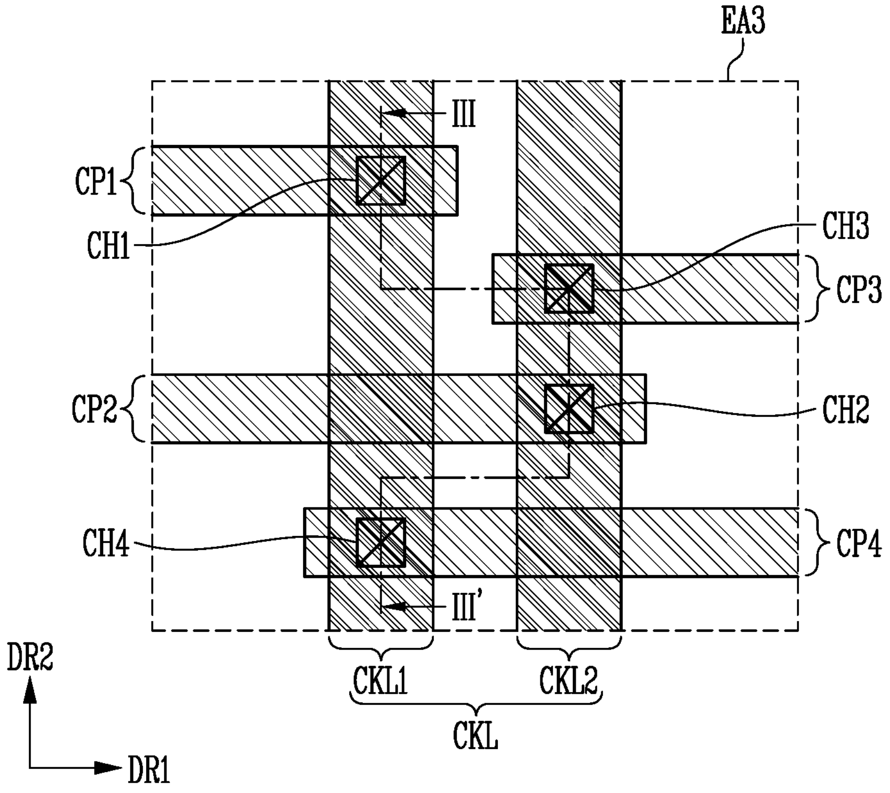
FIG. 17 illustrates a schematic enlarged view of a portion 'EA3' of FIG. 15.
Figure 18:
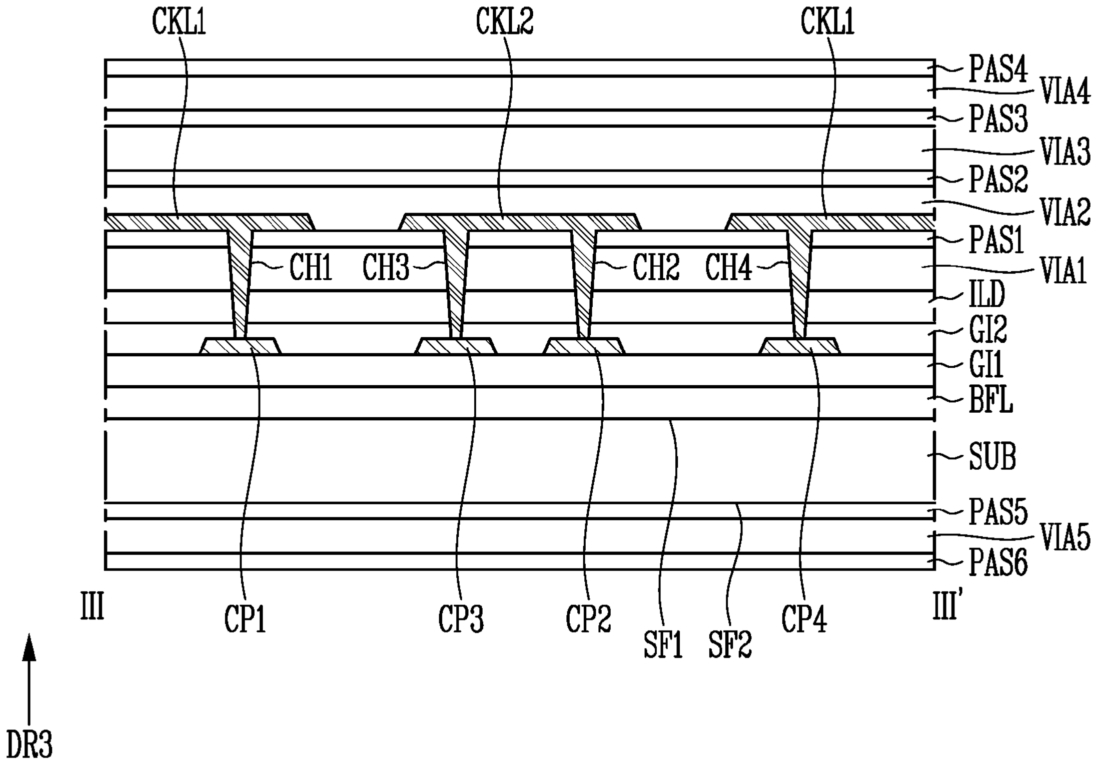
FIG. 18 and FIG. 19 illustrate schematic cross-sectional views taken along line III-III' of FIG. 17.
Figure 19:
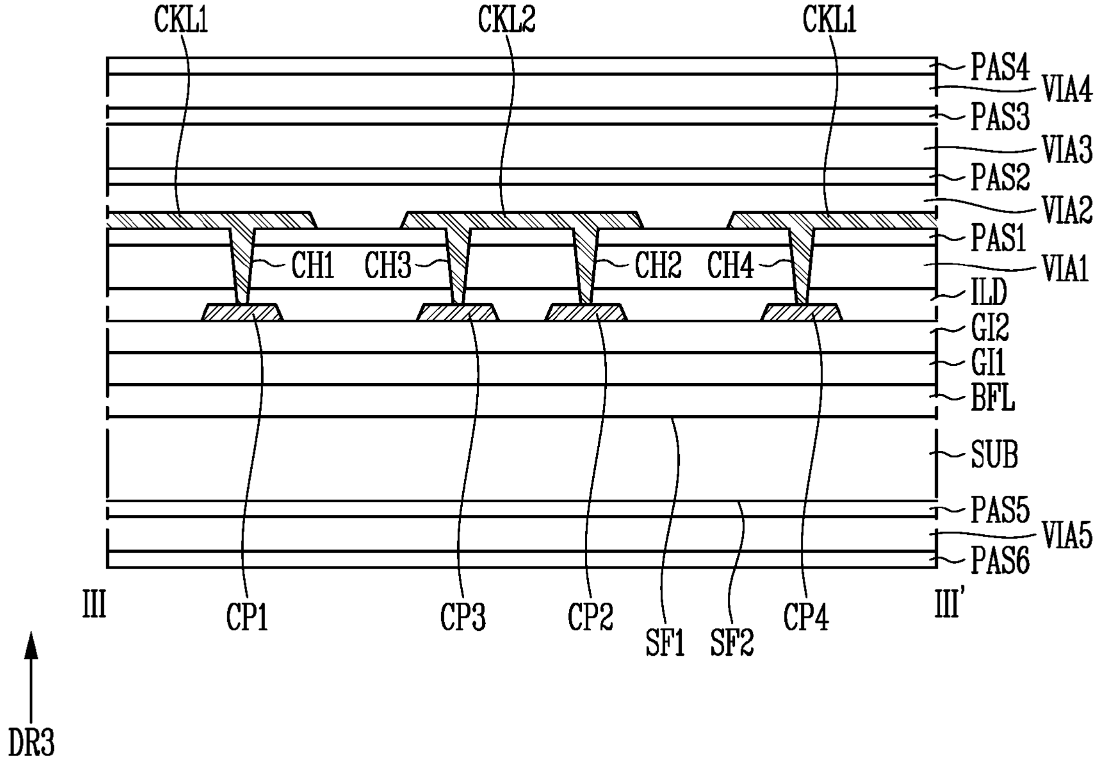

FIG. 14 schematically illustrates a disposition relationship between the pixel PXL and the gate driver GDR in the second sub-area A4*b* of the display device according to an embodiment. FIG. 15 and FIG. 16 schematically illustrate electrical connection relationships between the pixel circuit PXC and the gate driver GDR in the second sub-area A4*b* of the display device according to an embodiment. FIG. 17 illustrates a schematic enlarged view of a portion 'EA3' of FIG. 15. FIG. 18 and FIG. 19 illustrate schematic cross-sectional views taken along line II-III' of FIG. 17.

FIG. 16 illustrates a variation of FIG. 15 in relation to an electrical connection relationship between the pixel circuit PXC and the gate driver GDR.

FIG. 19 illustrates a variation of FIG. 18 in relation to positions of first to fourth conductive patterns CP1, CP2, CP3, and CP4.

In relation to the embodiments of FIG. 14 to FIG. 19, differences from the above-described embodiments will be described in order to avoid duplicate descriptions.

Referring to FIG. 1 to FIG. 19, the second sub-area A4*b* may include multiple unit pixel rows UPR in which pixels PXL may be arranged. Each of the pixels PXL may include the first sub-pixel SPX1, the second sub-pixel SPX2, and the third sub-pixel SPX3.

Each of the unit pixel rows UPR may include multiple first pixels PXL1 arranged in the first direction DR1 along the first pixel row PR1 and multiple second pixels PXL2 arranged in the first direction DR1 along the second pixel row PR2.

Each of the first pixels PXL1 may include a (1-1)-th sub-pixel SPX1_1, a (2-1)-th sub-pixel SPX2_1, and a (3-1)-th sub-pixel SPX3_1. Each of the second pixels PXL2 may include a (1-2)-th sub-pixel SPX1_2, a (2-2)-th sub-pixel SPX2_2, and a (3-2)-th sub-pixel SXP3_2. In an embodiment, the (1-1)-th sub-pixel SPX1_1 and the (1-2)-th sub-pixel SPX1_2 may be positioned adjacent to each other in the second direction DR2. The (2-1)-th sub-pixel SPX2_1 and the (2-2)-th sub-pixel SPX2_2 may be positioned adjacent to each other in the second direction DR2. The (3-1)-th sub-pixel SPX3_1 and the (3-2)-th sub-pixel SPX3_2 may be positioned adjacent to each other in the second direction DR2. The (1-1)-th sub-pixel SPX1_1 and the (1-2)-th sub-pixel SPX1_2 may emit light of the same color. The (2-1)-th sub-pixel SPX2_1 and the (2-2)-th sub-pixel SPX2_2 may emit light of the same color. The (3-1)-th sub-pixel SPX3_1 and the (3-2)-th sub-pixel SPX3_2 may emit light of the same color. For example, the (1-1)-th sub-pixel SPX1_1 and the (1-2)-th sub-pixel SPX1_2 may emit red light, and the (2-1)-th sub-pixel SPX2_1 and the (2-2)-th sub-pixel SPX2_2 may emit green light, and the (3-1)-th sub-pixel SPX3_1 and the (3-2)-th sub-pixel SPX3_2 may emit blue light.

Each of the (1-1)-th and (2-1)-th sub-pixels SPX1_1 and SPX2_1 may include a first light emitting portion EMU1 and a first pixel circuit PXC1. Each of the (1-2)-th and (2-2)-th sub-pixels SPX1_2 and SPX2_2 may include a second light emitting portion EMU2 and a second pixel circuit PXC2. Each of the (3-1)-th and (3-2)-th sub-pixels SPX3_1 and SPX3_2 may include a third light emitting portion EMU3 and a third pixel circuit PXC3. The first light emitting portion EMU1 may include a first electrode PE1, a second electrode PE2, and a first light emitting element LD1. The second light emitting portion EMU2 may include a first electrode PE1, a second electrode PE2, and a second light emitting element LD2. The third light emitting portion EMU3 may include a first electrode PE1, a second electrode PE2, and a third light emitting element LD3. The first light emitting element LD1 may be a micro light emitting diode emitting red light, the second light emitting element LD2 may be a micro light emitting diode emitting green light, and the third light emitting element LD3 may be a micro light emitting diode emitting blue light.

A first stage STG1 and a second stage STG2 may be disposed between two adjacent unit pixel rows UPR. The first stage STG1 and the second stage STG2 may be disposed between the second pixel row PR2 of a previous unit pixel row UPR (or a first unit pixel row) among two adjacent unit pixel rows UPR and the first pixel row PR1 of a next unit pixel row UPR (or a second unit pixel row) thereamong. Specifically, the first stage STG1 may be positioned at the left side of the clock line CKL between the second pixel row PR2 of the previous unit pixel row UPR (or the first unit pixel row) and the first pixel row PR1 of the next unit pixel row UPR (or the second unit pixel row), and the second stage STG2 may be disposed to be spaced apart from the first stage STG1 in the first direction DR1 and may be positioned at the right side of the clock line CKL.

The first stage STG1 may be electrically connected to the pixels PXL disposed in one of the first and second pixel rows PR1 and PR2 in each of the unit pixel rows UPR, and the second stage STG2 may be electrically connected to the pixels PXL disposed in another of the first and second pixel rows PR1 and PR2. Specifically, the first stage STG1 may be electrically connected to a gate line disposed in one of the first and second pixel rows PR1 and PR2 in each of the unit pixel rows UPR, and the second stage STG2 may be electrically connected to a gate line disposed in another of the first and second pixel rows PR1 and PR2.

In an embodiment of FIG. 15, the first stage STG1 may be electrically connected gate lines GLk+1, GLk+3, and GLk+5 disposed in the second pixel row PR2 through the corresponding connecting line CNL in each of the unit pixel rows UPR, and the second stage STG2 may be electrically connected to gate lines GLk, GLk+2, and GLk+4 disposed in the first pixel row PR1 through the corresponding connecting line CNL in the corresponding unit pixel row UPR. Here, k may be an integer of 2 or more, but is not limited thereto.

In an embodiment of FIG. 16, the first stage STG1 may be electrically connected gate lines the GLk, GLk+2, and GLk+4 disposed in the first pixel row PR1 through the corresponding connecting line CNL in each of the unit pixel rows UPR, and the second stage STG2 may be electrically connected to the gate lines GLk+1, GLk+3, and GLk+5 disposed in the second pixel row PR2 through the corresponding connecting line CNL in the corresponding unit pixel row UPR. The connecting wire CNL may be configured of at least one of the first to sixth conductive layers included in the pixel circuit layer PCL described with reference to FIG. 10 to FIG. 13, but is not limited thereto.

The clock line CKL may include a first clock line CKL1 and a second clock line CKL2. The first clock line CKL1 and the second clock line CKL2 may be disposed to be apart from each other in the first direction DR1. A clock signal of an inverted waveform may be applied to the first clock line CKL1 and the second clock line CKL2.

Each of the first stage STG1 and the second stage STG2 may be electrically connected to the first and second clock lines CKL1 and CKL2 through a corresponding conductive pattern CP. For example, the first stage STG1 may be electrically connected to the first clock line CKL1 through the first conductive pattern CP1, and may be electrically connected to the second clock line CKL2 through the second conductive pattern CP2. The second stage STG2 may be electrically connected to the second clock line CKL2 through the third conductive pattern CP3, and may be electrically connected to the first clock line CKL2 through the fourth conductive pattern CP4. The first, second, third, and fourth conductive patterns CP1, CP2, CP3, and CP4 may be disposed apart from each other.

The first clock line CKL1 and the second clock line CKL2 may extend along the second direction DR2. The first to fourth conductive patterns CP1, CP2, CP3, and CP4 may extend along the first direction DR1. The first conductive pattern CP1 may cross the first clock line CKL1, and the second conductive pattern CP2 may cross the first and second clock lines CKL1 and CKL2. The third conductive pattern CP3 may cross the second clock line CKL2, and the fourth conductive pattern CP4 may cross the first and second clock lines CKL1 and CKL2. The first clock line CKL1 may be electrically connected to the first conductive pattern CP1, and may be electrically connected to the fourth conductive pattern CP4. The second clock line CKL2 may be electrically connected to the second conductive pattern CP2, and may be electrically connected to the third conductive pattern CP3.

The first and second clock lines CKL1 and CKL2 may be configured of one of the first to sixth conductive layers included in the pixel circuit layer PCL. For example, the first and second clock lines CKL1 and CKL2 may be a fifth conductive layer positioned between the first passivation layer PAS1 and the second via layer VIA. The first and second clock lines CKL1 and CKL2 may be formed of the same material in the same process as the anode connecting line ACL and the third power line VSL.

In an embodiment of FIG. 18, the first, second, third, and fourth conductive patterns CP1, CP2, CP3, and CP4 may be configured as a second conductive layer disposed between the first gate insulating layer GI1 and the second gate insulating layer GI2. The first clock line CKL1 may pass through the first contact hole CH1 of each of the first passivation layer PAS1, the first via layer VIA1, the interlayer insulating layer ILD, and the second gate insulating layer GI2 to be connected to the first conductive pattern CP1. In addition, the first clock line CKL1 may pass through the fourth contact hole CH4 of each of the first passivation layer PAS1, the first via layer VIA1, the interlayer insulating layer ILD, and the second gate insulating layer GI2 to be connected to the fourth conductive pattern CP4. The second clock line CKL2 may pass through the second contact hole CH2 of each of the first passivation layer PAS1, the first via layer VIA1, the interlayer insulating layer ILD, and the second gate insulating layer GI2 to be connected to the second conductive pattern CP2. In addition, the second clock line CKL2 may pass through the third contact hole CH3 of each of the first passivation layer PAS1, the first via layer VIA1, the interlayer insulating layer ILD, and the second gate insulating layer GI2 to be connected to the third conductive pattern CP3.

In an embodiment of FIG. 19, the first, second, third, and fourth conductive patterns CP1, CP2, CP3, and CP4 may be configured as a third conductive layer disposed between the second gate insulating layer GI2 and the interlayer insulating layer ILD. The first clock line CKL1 may pass through the first contact hole CH1 of each of the first passivation layer PAS1, the first via layer VIA1, and the interlayer insulating layer ILD to be connected to the first conductive pattern CP1. In addition, the first clock line CKL1 may pass through the fourth contact hole CH4 of each of the first passivation layer PAS1, the first via layer VIA1, and the interlayer insulating layer ILD to be connected to the fourth conductive pattern CP4. The second clock line CKL2 may pass through the second contact hole CH2 of each of the first passivation layer PAS1, the first via layer VIA1, and the interlayer insulating layer ILD to be connected to the second conductive pattern CP2. In addition, the second clock line CKL2 may pass through the third contact hole CH3 of each of the first passivation layer PAS1, the first via layer VIA1, and the interlayer insulating layer ILD to be connected to the third conductive pattern CP3.

In the above-described embodiment, the first, second, third, and fourth conductive patterns CP1, CP2, CP3, and CP4 have been all described as being formed of the same material in the same process, but are not limited thereto. In some embodiments, at least one of the first, second, third, and fourth conductive patterns CP1, CP2, CP3, and CP4 may be formed of different materials in different processes. Each of the first, second, third, and fourth conductive patterns CP1, CP2, CP3, and CP4 may have various positions within a range that may be stably connected to the corresponding clock line CKL.

According to an above-described embodiment, one first stage STG1 may be disposed at the left side of the clock line CKL and one second stage STG2 may be disposed at the right side thereof, between two adjacent unit pixel rows UPR in at least the second sub-area A4*b* of the display device DD, so that the degree of integrated freedom of the gate driver GDR may be improved regardless of increase in resolution.

Figure 20:
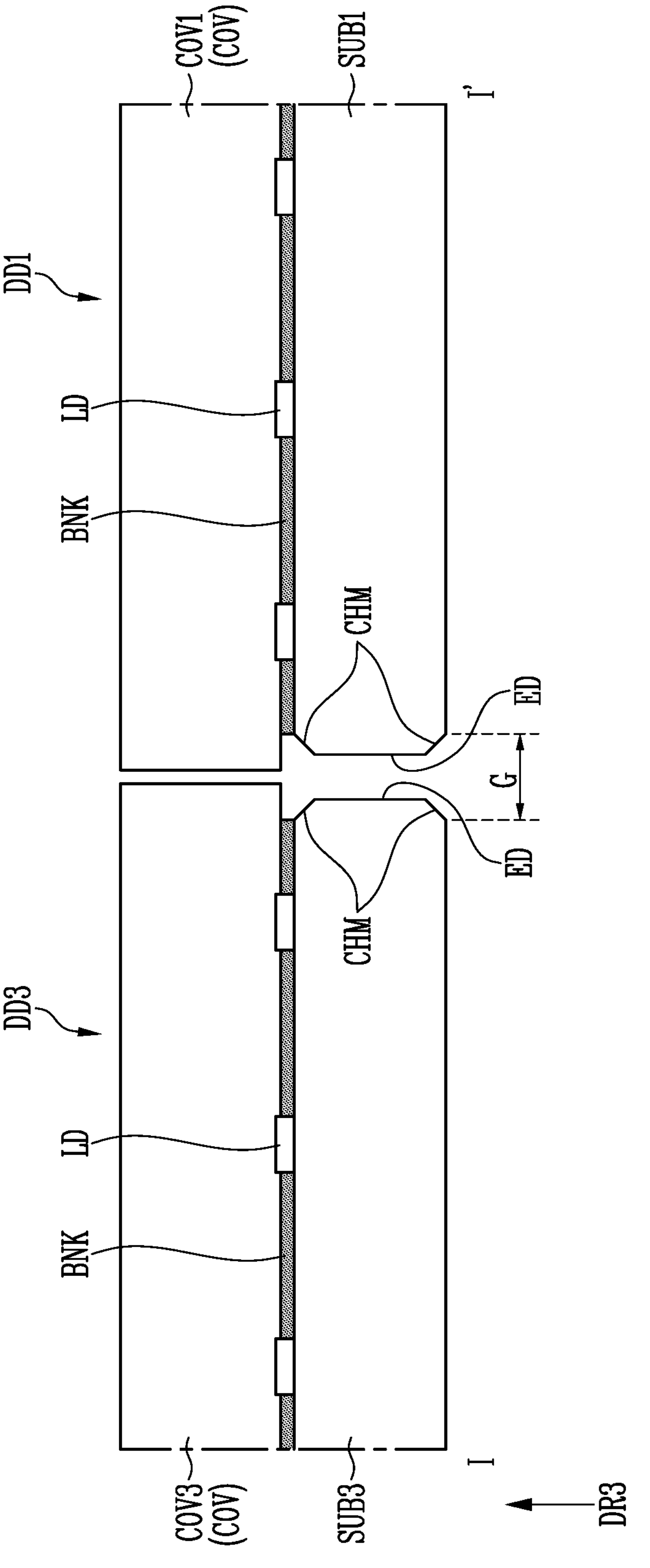
FIG. 20 and FIG. 21 illustrate schematic cross-sectional views taken along line I-I' of FIG. 1.
Figure 21:
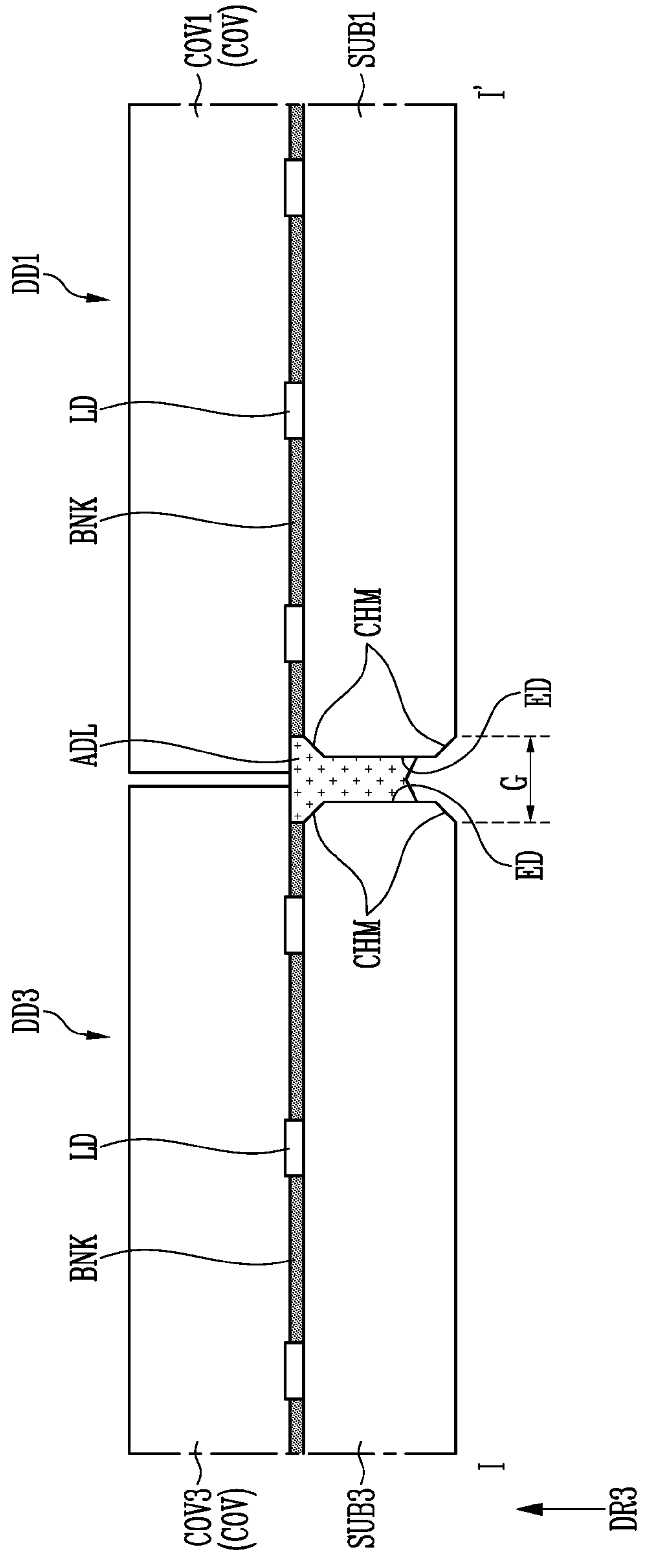

FIG. 20 and FIG. 21 illustrate schematic cross-sectional views taken along line I-I' of FIG. 1.

FIG. 21 illustrates a variation of FIG. 20 in relation to an additional member ADL and the like.

Referring to FIG. 1 to FIG. 21, the tiled display device TDD may include a first display device DD1 and a third display device DD3 positioned adjacent to each other.

The first display device DD1 may include a first substrate SUB1, a light emitting element LD, a bank BNK, and a first cover layer COV1. The third display device DD3 may include a third substrate SUB3, a light emitting element LD, a bank BNK, and a third cover layer COV3. Each of the first cover layer COV1 and the third cover layer COV3 may have the same configuration as the cover layer COV described with reference to FIG. 12.

Each of the first substrate SUB1 and third substrate SUB3 may include the substrate SUB described with reference to FIG. 10 to FIG. 13, the pixel circuit layer PCL disposed on the first surface SF1 of the substrate SUB, and certain components disposed on the second surface SF2 of the substrate SUB. A housing HS may be positioned on a lower surface (or rear surface) of each of the first and third substrates SUB1 and SUB3.

Each of the first and third display devices DD1 and DD3 may include a chamfered portion CHM. The chamfered portion CHM may prevent the first and third display devices DD1 and DD3 from being collided and damaged in case that the first and third display devices DD1 and DD3 are combined.

Light emitting elements LD and a bank BNK positioned between the light emitting elements LD may be provided on the first substrate SUB1 and the third substrate SUB3, respectively. Each of the bank BNK and the light emitting elements LD may have the same configuration as the light emitting element LD and the bank BNK described with reference to FIG. 10 to FIG. 13.

The first cover layer COV1 may be provided to cover the first substrate SUB1 and the light emitting elements LD mounted thereon to protect the first substrate SUB1 and the light emitting elements LD from the outside. The third cover layer COV3 may be provided to cover the third substrate SUB3 and the light emitting elements LD mounted thereon to protect the third substrate SUB3 and the light emitting elements LD from the outside. The first cover layer COV1 and the third cover layer COV3 may reduce the visibility of the coupling area SM (or seam) formed by a gap G formed between the first substrate SUB1 (or the first display device DD1) and the third substrate SUB3 (or the third display device DD3), and may improve color deviation between the first display device DD1 and the third display device DD3.

The first cover layer COV1 may protrude outside the edge ED of the first substrate SUB1, and the third cover layer COV3 may protrude outside the edge ED of the third substrate SUB3. The gap G between the first substrate SUB1 and the third substrate SUB3 may be larger than that between the first cover layer COV1 and the third cover layer COV3.

In an embodiment of FIG. 21, an additional member ADL may be disposed at the gap G between the first substrate SUB1 and the third substrate SUB3.

The additional member ADL may be provided to absorb light incident on the gap G. The additional member ADL may cover the chamfered portion CHM of the first substrate SUB1 and the third substrate SUB3. The additional member ADL may fill both a space that may occur between the first substrate SUB1 and the first cover layer COV1 and a space between the third substrate SUB3 and the third cover layer COV3. The additional member ADL may prevent foreign particles or moisture from being introduced into the space between the first substrate SUB1 and the first cover layer COV1 and the space between the third substrate SUB3 and the third cover layer COV3, respectively. The additional member ADL may include a material that absorbs light. As an example, the additional member ADL may include a photosensitive material, but is not limited thereto.

Figure 22:
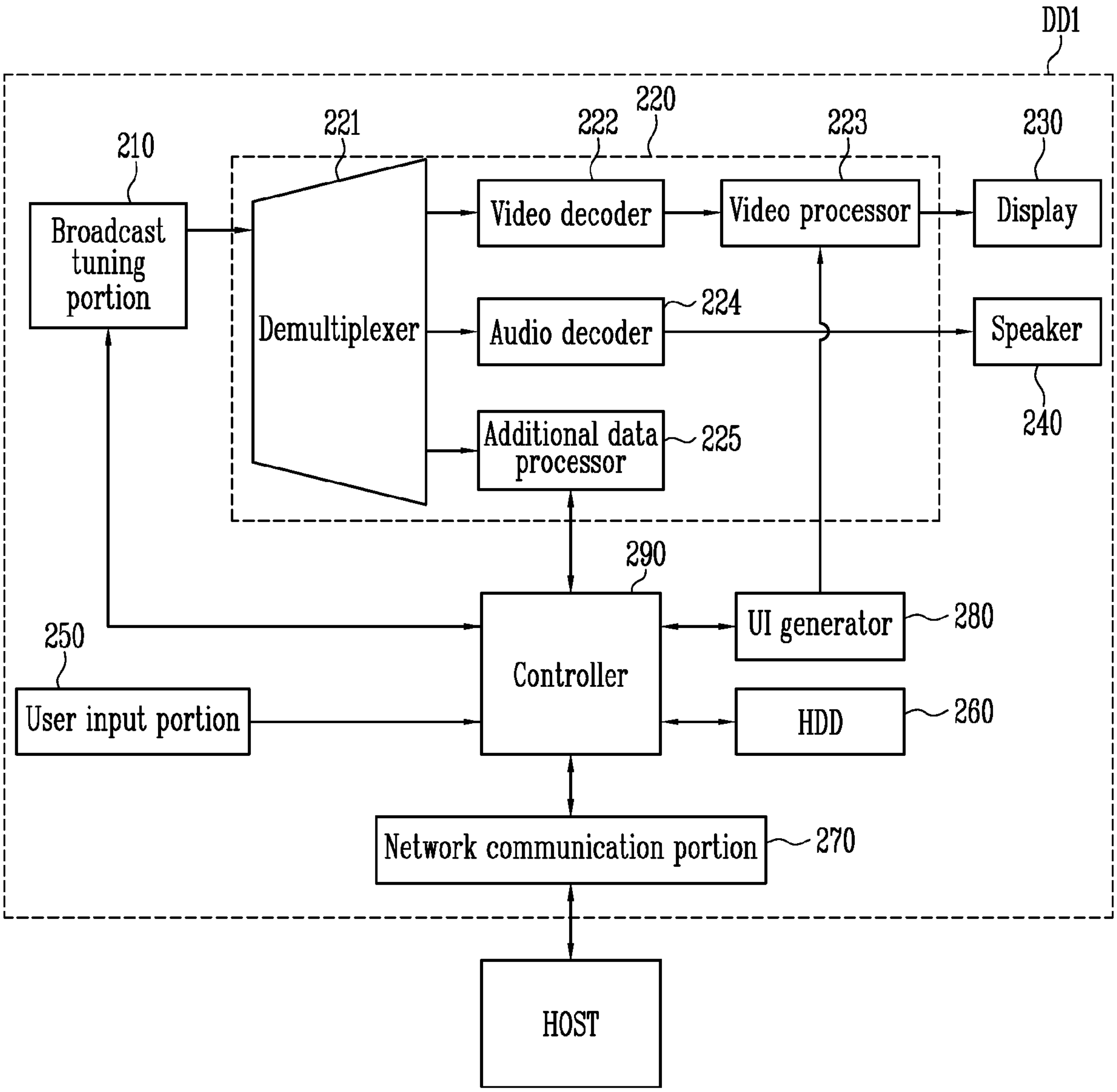
FIG. 22 schematically illustrates a block diagram of a tiled display device according to an embodiment.

FIG. 22 schematically illustrates a block diagram of a tiled display device according to an embodiment.

FIG. 22 illustrates, for better comprehension and ease of description, the first display device DD1 and a host system HOST.

Referring to FIG. 1 to FIG. 22, the tiled display device TDD according to an embodiment may include the host system HOST and the display devices DD.

The host system HOST may be implemented as one of a television system, a home theater system, a set-top box, a navigation system, a DVD player, a Blu-ray player, a personal computer, a mobile phone system, and a tablet.

A user's command may be input to the host system HOST in various formats. For example, a command by a user's touch input may be input to the host system HOST. In addition, a user's command by a keyboard input or a button input of a remote controller may be input to the host system HOST.

The host system HOST may receive an original video data corresponding to an original image from the outside. The host system HOST may divide the original video data by the number of display devices DD. For example, the host system HOST may divide the original video data into a first video data corresponding to a first image, a second video data corresponding to a second image, a third video data corresponding to a third image, and a fourth video data corresponding to a fourth image, corresponding to the first display device DD1, the second display device DD2, the third display device DD3, and the fourth display device DD4. The host system HOST may transmit the first video data to the first display device DD1, transmit the second video data to the second display device DD2, transmit the third video data to the third display device DD3, and transmit the fourth video data to the fourth display device DD4.

The first display device DD1 may display the first image according to the first video data, the second display device DD2 may display the second image according to the second video data, the third display device DD3 may display the third image according to the third video data, and the fourth display device DD4 may display the fourth image according to the fourth video data. Accordingly, the user may view the original image in which the first to fourth images displayed on the first to fourth display devices DD1, DD2, DD3, and DD4 may be combined.

The first display device DD1 may include a broadcast tuning portion 210, a signal processor 220, a display portion 230, a speaker 240, a user input portion 250, an HDD 260, a network communication portion 270, a UI generator 280, and a controller 290.

The broadcast tuning portion 210 may receive a broadcast signal of a corresponding channel through an antenna by tuning a predetermined channel frequency according to control of the controller 290. The broadcast tuning portion 210 may include a channel detection module and an RF demodulation module.

The broadcast signal demodulated by the broadcast tuning portion 210 may be processed by the signal processor 220 to output to the display portion 230 and the speaker 240. Here, the signal processor 220 may include a demultiplexer 221, a video decoder 222, a video processor 223, an audio decoder 224, and an additional data processor 225.

The demultiplexer 221 may separate the demodulated broadcast signal into a video signal, an audio signal, and additional data. The separated video signal, audio signal, and additional data may be restored by the video decoder 222, the audio decoder 224, and the additional data processor 225, respectively. The video decoder 222, the audio decoder 224, and the additional data processor 225 may restore the signals into a decoding format corresponding to an encoding format in case that a broadcast signal is transmitted.

The decoded video signal may be converted by the video processor 223 to fit a vertical frequency, a resolution, a screen ratio, and the like that meet an output standard of the display portion 230, and the decoded audio signal may be output to the speaker 240.

The display portion 230 may include a display panel DP on which an image is displayed and a panel driver for controlling driving of the display panel DP.

The user input portion 250 may receive a signal transmitted by the host system HOST. The user input portion 250 allows the user to receive commands related to communication with other display devices DD2, DD3, and DD4 as well as data related to channel selection, user interface (UI) menu selection, and operation transmitted by the host system HOST. Data for selection and input may be provided to be input.

The HDD 260 may store various software programs including OS programs, recorded broadcast programs, moving pictures, photos, and other data, and may be realized as a storage medium such as a hard disk or a non-volatile memory.

The network communication portion 270 may be for short-distance communication with the host system HOST and other display devices DD2, DD3, and DD4, and may be a communication module including an antenna pattern that can implement mobile communication, data communication, Bluetooth, RF, Ethernet, and the like.

The network communication portion 270 may be a technical standard or communication method for mobile communication (for example, Global System for Mobile communication (GSM), Code Division Multi Access (CDMA), Code Division Multi Access (CDMA2000)) through an antenna pattern to be described later, Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, and the like) may transmit/receive a radio signal with at least one of a base station, an external terminal, and a server on a mobile communication network.

The network communication portion 270 may transmit/receive a wireless signal in a communication network according to wireless Internet technologies through an antenna pattern to be described later. As wireless Internet technologies, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), and the like, and the antenna pattern transmits and receives data according to at least one wireless Internet technology within a range including Internet technologies not listed above.

The UI generator 280 generates a UI menu for communication with the host system HOST and other display devices DD2, DD3, and DD4, and may be implemented by an algorithm code and an OSD IC. The UI menu for communication with the host system HOST and other display devices DD2, DD3, and DD4 may be a menu for designating a counterpart digital TV for communication and selecting a desired function.

The controller 290 may be in charge of overall control of the first display device DD1 and may be in charge of communication control of the host system HOST and other display devices DD2, DD3, and DD4, and a corresponding algorithm code for control may be stored and, and it may be implemented by a micro controller unit (MCU) in which the stored algorithm code may be executed.

The controller 290 controls to transmit the corresponding control command and data to the host system HOST and other display devices DD2, DD3, and DD4 through the network communication portion 270 according to the input and selection of the user input portion 250. Of course, in case that a predetermined control command and data are input from the host system HOST and other display devices DD2, DD3, and DD4, an operation may be performed according to the control command.

A block diagram of the second display device DD2, a block diagram of the third display device DD3, and a block diagram of the fourth display device DD4 may be substantially the same as the block diagram of the first display device DD1 described with reference to FIG. 22, so duplicate descriptions will be omitted.

While the disclosure has been shown and described with reference to certain embodiments thereof, it will be understood by those skilled in the art that various changes in forms and details may be made therein without departing from the spirit and scope of the disclosure.

What is claimed is:

1. A display device comprising:

a substrate that includes a display area, and a non-display area disposed at a side of the display area, the substrate being made of glass, and the display area including:
- a first area including an antistatic circuit;
- a second area including a fanout line;
- a third area including a demultiplexer; and
- a fourth area including a pixel circuit, a first sub-area adjacent to at least one of the first area, the second area, or the third area, and a second sub-area excluding the first sub-area, wherein the second sub-area includes:
- unit pixel rows respectively comprising a pair of pixel rows;
- first pixels disposed in a first direction in a first pixel row of one of the unit pixel rows;
- second pixels disposed in the first direction in a second pixel row of the one of the unit pixel rows that is a next row of the first pixel row, the second pixels being spaced apart from the first pixels;
- a clock line extending in a second direction intersecting the first direction; and
- a gate driver including:
  - a first stage disposed left of the clock line in plan view; and
  - a second stage disposed right of the clock line in plan view, wherein at least one of the first stage or the second stage is disposed directly between two pixels, and wherein the first stage and the second stage are disposed between two adjacent ones of the unit pixel rows in the second direction, and are respectively disposed between corresponding pairs of directly adjacent pixel columns in the first direction.

2. The display device of claim 1, wherein the first stage and the second stage are provided in plural, and wherein one of the first stages and one of the second stages are disposed between the two adjacent ones of the unit pixel rows.

3. The display device of claim 2, wherein the one of the first stages and the one of the second stages are disposed between the second pixel row of a first unit pixel row and the first pixel row of a second unit pixel row, among the two adjacent ones of the unit pixel rows.

4. A display device comprising:

a substrate comprising glass, and having a display area, and a non-display area at a side of the display area, the display area comprising:
- a first area comprising an antistatic circuit;
- a second area comprising a fanout line;
- a third area comprising a demultiplexer; and
- a fourth area comprising a pixel circuit, and having:
  - a first sub-area adjacent to at least one of the first area, the second area, or the third area; and
  - a second sub-area comprising:
    - unit pixel rows comprising a first pixel row comprising first pixels arranged in a first direction, and a second pixel row subsequent to the first pixel row and comprising second pixels spaced apart from the first pixels and arranged in the first direction;
    - a clock line extending in a second direction crossing the first direction; and
    - a gate driver comprising a first stage on one side of the clock line in plan view, and a second stage on another side of the clock line in plan view, wherein at least one of the first stage or the second stage is between two pixels, wherein the first stage and the second stage are located between two adjacent ones of the unit pixel rows in the second direction, wherein the first stage and the second stage are provided in plural, wherein one of the first stages and one of the second stages are located between the two adjacent ones of the unit pixel rows, wherein the clock line is configured to provide a clock signal to both the first stage and the second stage, and extends between two pixels, and wherein a gap between the first stage and the clock line in the first direction and a gap between the second stage and the clock line in the first direction are same.

5. The display device of claim 4, wherein the first stage and the second stage are symmetrically positioned with respect to the clock line in plan view.

6. The display device of claim 4, wherein the first stage is electrically connected to the first pixels, and wherein the second stage is electrically connected to the second pixels.

7. The display device of claim 4, wherein the first stage is electrically connected to the second pixels, and wherein the second stage is electrically connected to the first pixels.

8. The display device of claim 4, wherein the clock line includes a first clock line and a second clock line that extend in the second direction and are spaced apart from each other in the first direction, and wherein the first stage and the second stage are electrically connected to the first and second clock lines through a conductive pattern.

9. The display device of claim 8, wherein the conductive pattern includes:

a first conductive pattern that electrically connects the first stage and the first clock line;

a second conductive pattern that electrically connects the first stage and the second clock line;

a third conductive pattern that electrically connects the second stage and the first clock line; and a fourth conductive pattern that electrically connects the second stage and the second clock line, and wherein the first and second clock lines and the first to fourth conductive patterns are provided on different layers.

10. The display device of claim 9, wherein the first and second clock lines are disposed on the first to fourth conductive patterns with an insulating layer therebetween, wherein the first clock line is electrically connected to the first conductive pattern through a first contact hole of the insulating layer, wherein the second clock line is electrically connected to the second conductive pattern through a second contact hole of the insulating layer, wherein the first clock line is electrically connected to the third conductive pattern through a third contact hole of the insulating layer, and wherein the second clock line is electrically connected to the fourth conductive pattern through a fourth contact hole of the insulating layer.

11. The display device of claim 4, wherein the first pixels and each of the second pixels includes:

a display element layer including a light-emitting element; and a pixel circuit layer that includes the pixel circuit electrically connected to the light-emitting element, and a power line electrically connected to the pixel circuit, wherein the display element layer further includes a first electrode and a second electrode that are electrically connected to the light-emitting element and are spaced apart from each other, wherein one of the first electrode or the second electrode is electrically connected to the pixel circuit, and wherein the other of the first electrode or the second electrode is electrically connected to the power line.

12. The display device of claim 11, wherein the pixel circuit is not disposed in the first area, the second area, or the third area, and wherein the light-emitting element is disposed in at least two of the first area, the second area, or the third area.

13. The display device of claim 12, wherein at least two of the light-emitting elements disposed in the at least two of the first area, the second area, or the third area are electrically connected to the pixel circuit disposed in the first sub-area.

14. The display device of claim 11, wherein the light-emitting element includes a flip chip type of micro light-emitting diode.

15. The display device of claim 14, further comprising a bank adjacent to the light-emitting element, and comprising a light-blocking material.

16. The display device of claim 11, wherein the substrate includes:

a first surface on which the light-emitting element is disposed;

a second surface facing the first surface; and a side surface between the first surface and the second surface to be continuous to the first surface and the second surface, and wherein a pad portion and a side connecting wire surrounding the pad portion, the side surface, and the second surface are disposed in the non-display area.

17. The display device of claim 16, wherein the substrate further includes a chamfered portion formed between the first surface and the side surface, and wherein the side connecting wire entirely surrounds the chamfered portion.

18. The display device of claim 16, further comprising:

a cover layer overlapping the first surface of the substrate;

an intermediate layer disposed between the cover layer and the first surface to couple the cover layer and the substrate; and a flexible film disposed on the second surface of the substrate and electrically connected to the side connecting wire through a conductive member, wherein the cover layer protrudes outward from the side surface of the substrate.

19. A tiled display device comprising:

display devices disposed in a matrix format, and comprising a substrate that includes a display area and a non-display area disposed at least at a side of the display area, the substrate being made of glass wherein the display area includes:

a first area including an antistatic circuit;

a second area including a fanout line;

a third area including a demultiplexer; and a fourth area including a pixel circuit, a first sub-area adjacent to at least one of the first area, the second area, or the third area, and a second sub-area excluding the first sub-area, wherein the second sub-area includes:

unit pixel rows respectively comprising a pair of pixel rows;

first pixels disposed in a first direction in a first pixel row of one of the unit pixel rows;

second pixels disposed in the first direction in a second pixel row of the one of the unit pixel rows that is a next row of the first pixel row, the second pixels being spaced apart from the first pixels;

a clock line extending in a second direction intersecting the first direction; and a gate driver including:

a first stage disposed left of the clock line in plan view;

a second stage disposed right of the clock line in plan view; and a third stage, wherein at least one of the first stage or the second stage is disposed directly between two pixels of the first pixels or the second pixels, and wherein the third stage is between two adjacent ones of the unit pixel rows in the second direction, and between corresponding pairs of directly adjacent pixel columns in the first direction.

* * * * *